US012701825B2

(12) United States Patent
Jiang et al.

(10) Patent No.: US 12,701,825 B2
(45) Date of Patent: Aug. 4, 2026

(54) CURVED SEMICONDUCTOR CHIP AND METHOD FOR FORMING THE SAME

(71) Applicant: TAIWAN SEMICONDUCTOR MANUFACTURING COMPANY LTD., Hsinchu (TW)

(72) Inventors: Jheng-Hong Jiang, Hsinchu (TW);
Shing-Huang Wu, Hsinchu City (TW);
Chia-Wei Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 689 days.

(21) Appl. No.: 17/820,558

(22) Filed: Aug. 17, 2022

(65) Prior Publication Data

US 2024/0063338 A1 Feb. 22, 2024

(51) Int. Cl.
| | |
|---|---|
| *H10H 20/819* | (2025.01) |
| *G02B 27/01* | (2006.01) |
| *H10H 20/01* | (2025.01) |
| *H10H 20/852* | (2025.01) |
| *H10H 20/857* | (2025.01) |
| *H10P 95/90* | (2026.01) |
| *H10W 90/00* | (2026.01) |

(52) U.S. Cl.
CPC .......... *H10H 20/819* (2025.01); *H10H 20/01* (2025.01); *H10H 20/852* (2025.01); *H10H 20/857* (2025.01); *H10P 95/906* (2026.01); *H10W 90/00* (2026.01); *G02B 27/0172* (2013.01); *H10H 20/0364* (2025.01)

(58) Field of Classification Search
None
See application file for complete search history.

(56) References Cited

U.S. PATENT DOCUMENTS

| | | | | |
|---|---|---|---|---|
| 6,323,832 | B1 * | 11/2001 | Nishizawa | G09F 13/22 |
| | | | | 313/500 |
| 10,381,581 | B2 * | 8/2019 | Jeong | H10K 59/873 |
| 10,516,118 | B2 * | 12/2019 | Kuwabara | H10K 59/873 |
| 10,957,753 | B2 * | 3/2021 | Eo | H10K 59/124 |
| 11,462,700 | B2 * | 10/2022 | Tanaka | H05B 33/02 |
| 2016/0218305 | A1 * | 7/2016 | Kim | H10K 77/111 |
| 2020/0075666 | A1 * | 3/2020 | Kawaguchi | H10H 29/142 |
| 2021/0066653 | A1 * | 3/2021 | Luo | H10K 71/00 |
| 2021/0126073 | A1 * | 4/2021 | Xu | H10K 59/122 |
| 2021/0336234 | A1 * | 10/2021 | Zheng | H10K 77/111 |
| 2021/0364799 | A1 * | 11/2021 | Guo | G02B 27/1013 |
| 2023/0043608 | A1 * | 2/2023 | Jiang | G09F 21/02 |
| 2023/0112331 | A1 * | 4/2023 | Lee | H10H 20/819 |
| | | | | 257/79 |

* cited by examiner

*Primary Examiner* — Nishath Yasmeen
(74) *Attorney, Agent, or Firm* — WPAT LAW; Anthony King

(57) ABSTRACT

The present disclosure provides a semiconductor device. The semiconductor device includes: a substrate, having a first side and a second side opposite to the first side, wherein the substrate includes a plurality of trenches at the second side; a device layer, disposed on the first side of the substrate; an interconnect layer, disposed on the device layer; a luminous layer, disposed on the interconnect layer; and a capping layer, conformally disposed on the second side of the bended substrate. The semiconductor device is convexly curved.

20 Claims, 36 Drawing Sheets

20A

CURVED SEMICONDUCTOR CHIP AND METHOD FOR FORMING THE SAME

BACKGROUND

A display device is an output device for presentation of information in visual form. Near eye displays (NED) which are wearable display devices, can create a virtual image in the field of view of one or both eyes. Nowadays, the luminous layer of most display devices is made in flat structures. In such structures, a best field of view is only in the middle of the display device. Image distortions are easy to occur at edges.

Therefore, there is a need to improve the structure of a display device.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

DETAILED DESCRIPTION

Figure 1:
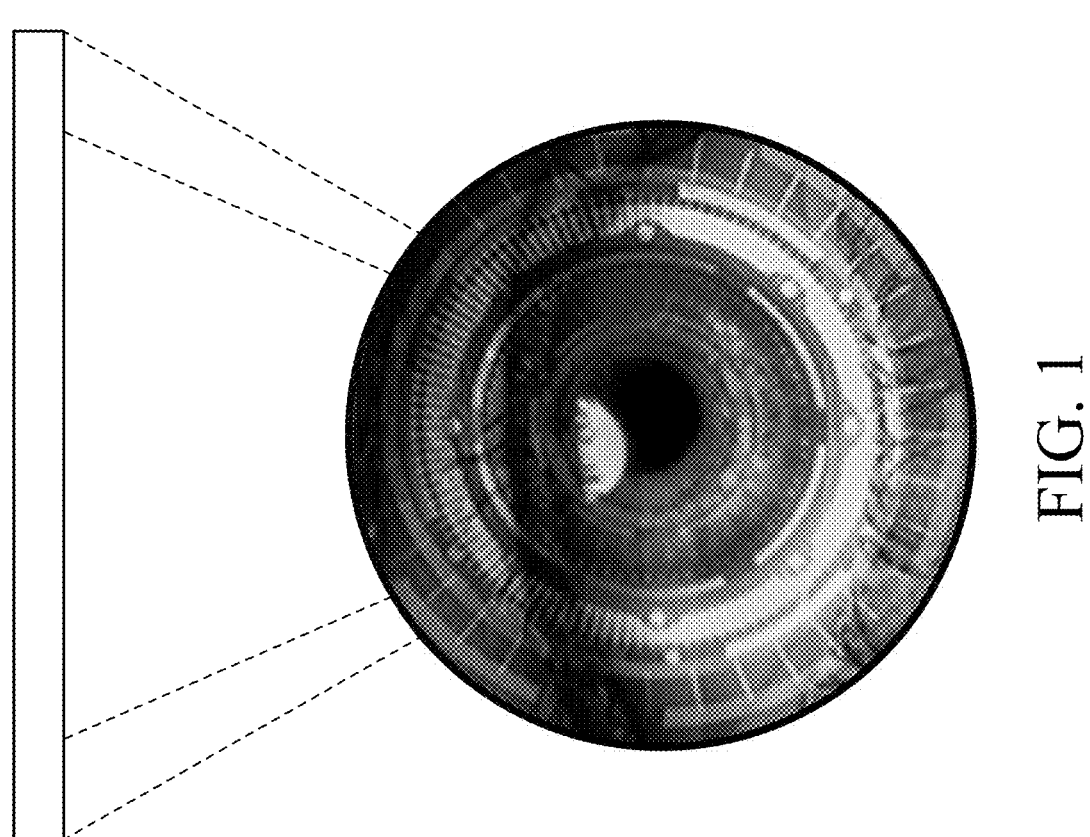
FIG. 1 is a schematic view of a near eye display device.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic view of a near eye display device 20A. The display device 20A is a flat structure such that a luminous layer of the display device 20A is also in a flat form. A best field of view is therefore be limited. The best field of view may only lies in the middle of the display device 20A. Image distortions are easy to occur at its left and right edges.

The present disclosure provides a semiconductor chip which has a curved profile. Optical display devices are conformally formed in the semiconductor chip such that the optical display devices are also arranged in a curved manner. The curved optical display devices can provide users with a better field of view.

Figure 2A:
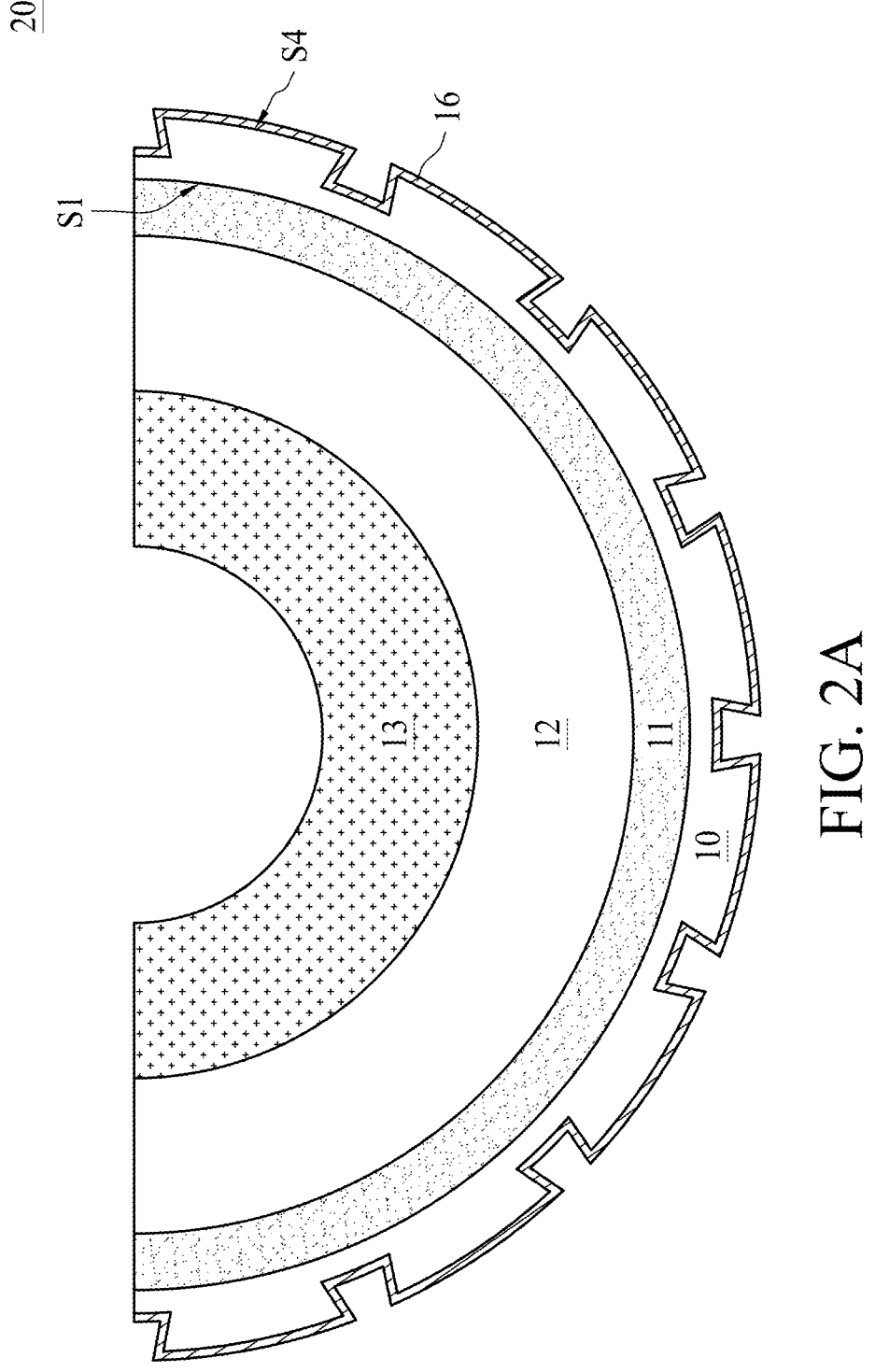
FIG. 2A is a schematic cross-sectional view of a semiconductor chip, in accordance with some embodiments of the present disclosure.

FIG. 2A is a schematic cross-sectional view of a semiconductor chip 20. The semiconductor chip 20 includes a substrate 10. The substrate 10 has a top surface S1 and a bottom surface S4 opposite to the top surface S1. The top surface S1 and the bottom surface S4 have the same curvature. The top surface S1 faces inwardly and the bottom surface S4 faces outwardly. A length of the top surface S1 is less than a length of the bottom surface S4. A device layer 11 is disposed on the top surface S1 of the substrate 10. An interconnect layer 12 is disposed on the device layer 11. A luminous layer 13 (or an optical device layer 13) is disposed on the interconnect layer 12. The substrate 10 may include multiple isolation structures and wells separated by the isolation structures.

The device layer 11 may include multiple transistors surrounded by a dielectric layer disposed on the substrate 10. The transistors may be separated by the isolation structures in the substrate 10. Each transistor may include a gate structure and its corresponding source/drain structures. Each gate structure may include a gate dielectric layer surrounded by lightly doped source/drain (LDD) regions in the substrate 10. Each gate structure may be surrounded by a gate spacer. The gate spacer may at least cover portions of the LDD regions. The source/drain structures may include epitaxial features. A silicide layer, such as cobalt silicide (CoSi), nickel silicide (NiSi) or tungsten silicide (WSi) may be disposed on a top surface of each epitaxial feature. Multiple conductive contacts may be respectively disposed on the gate structure and the source/drain structures of each transistor.

The interconnect layer 12 may include multiple mutually connected conductive vias and conductive lines. The conductive vias and the conductive lines are embedded in one or more inter-layer dielectric (ILD) layers or inter-metal dielectric (IMD) layers. The conductive vias and the conductive lines in the interconnect layer 12 may be electrically coupled to the transistors through the conductive contacts in the device layer 11.

The luminous layer 13 may include multiple optical devices or optical display devices such as a liquid-crystal display (LCD) device, a light-emitting diode (LED) device, a micro LED device, an organic light-emitting diode (OLED) device, a quantum dot display device, a light modulator, and the like. The optical devices or optical display devices in the luminous layer 13 may be electrically coupled to the transistors through the conductive vias and the conductive lines in the interconnect layer 12 and the conductive contacts in the device layer 11.

A capping layer 16 is conformally disposed on the bottom surface S4 of the substrate 10. The semiconductor chip 20 is convex curved such that the substrate 10, the device layer 11, the interconnect layer 12, the luminous layer 13 and the capping layer 16 are also curved. The substrate 10 is outwardly curved from the top surface S1 towards the bottom surface S4 on which the capping layer 16 is disposed. As shown in FIG. 2A, the substrate 10, the device layer 11, the interconnect layer 12, the luminous layer 13 and the capping layer 16 may have a smile profile. The substrate 10, the device layer 11, the interconnect layer 12, the luminous layer 13 and the capping layer 16 have the same curvature.

Figure 2B:
FIG. 2B is an enlarged view of FIG. 2A, in accordance with some embodiments of the present disclosure.

FIG. 2B is an enlarged view of FIG. 2A. The capping layer 16 has a thickness in a range between about 5 angstroms (Å) and about 100 nm. The thickness of the capping layer 16 is inconsistent along the bottom surface S4. The capping layer 16 includes a first portion 1611, a second portion 1612 and a third portion 1613. The portions 1611, 1612 and 1613 of the capping layer 16 have different thicknesses. A thickness A11 of the third portion 1613 is greater than a thickness B11 of the second portion 1612. The thickness B11 of the second portion 1612 is greater than a thickness C1 of the first portion 1611. The substrate 10 of the semiconductor chip 20 includes multiple trenches T1 alternately arranged with multiple protrusions 104P. The capping layer 16 does not completely fill the trenches T1. The first portion 1611 surrounds one or more openings O1611, the second portion 1612 surrounds one or more openings O1612 and the third portion 1613 surrounds one or more openings O1613.

Figure 3:
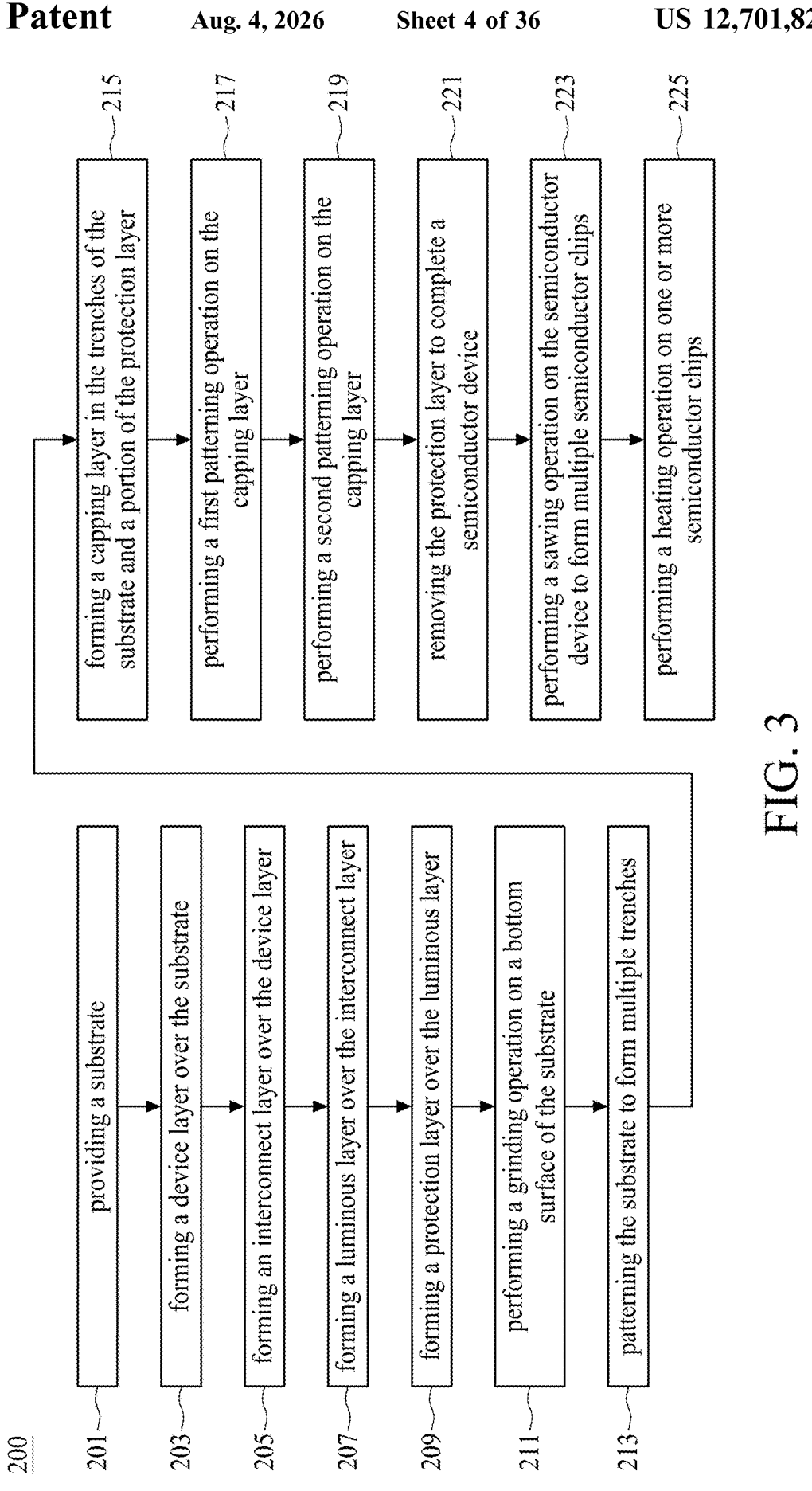
FIG. 3 is a flow diagram showing a method of fabricating a semiconductor chip, in accordance with some embodiments of the present disclosure.

FIG. 3 is a flow diagram showing a method 200 of fabricating a semiconductor chip. FIGS. 4 to 16C are schematic cross-sectional, top or bottom views illustrating sequential operations of the method 200 shown in FIG. 3. The method 200 includes a number of operations (201, 203, 205, 207, 209, 211, 213, 215, 217, 219, 221, 223 and 225) and the description and illustration are not deemed as a limitation to the sequence of the operations. A substrate is provided in operation 201. A device layer is formed over the substrate in operation 203. An interconnect layer is formed over the device layer in operation 205. A luminous layer is formed over the interconnect layer in operation 207. A protection layer is formed over the luminous layer in operation 209. A grinding operation is performed on a bottom surface of the substrate in operation 211. The substrate is patterned to form multiple trenches in operation 213. A capping layer is formed in the trenches of the substrate and a portion of the protection layer in operation 215. A first patterning operation is performed on the capping layer in operation 217. A second patterning operation is performed on the capping layer in operation 219. The protection layer is removed to complete a semiconductor device in operation 221. A sawing operation is performed on the semiconductor device to form multiple semiconductor chips in operation 223. A heating operation is performed on one or more semiconductor chips in operation 225.

Figure 4:
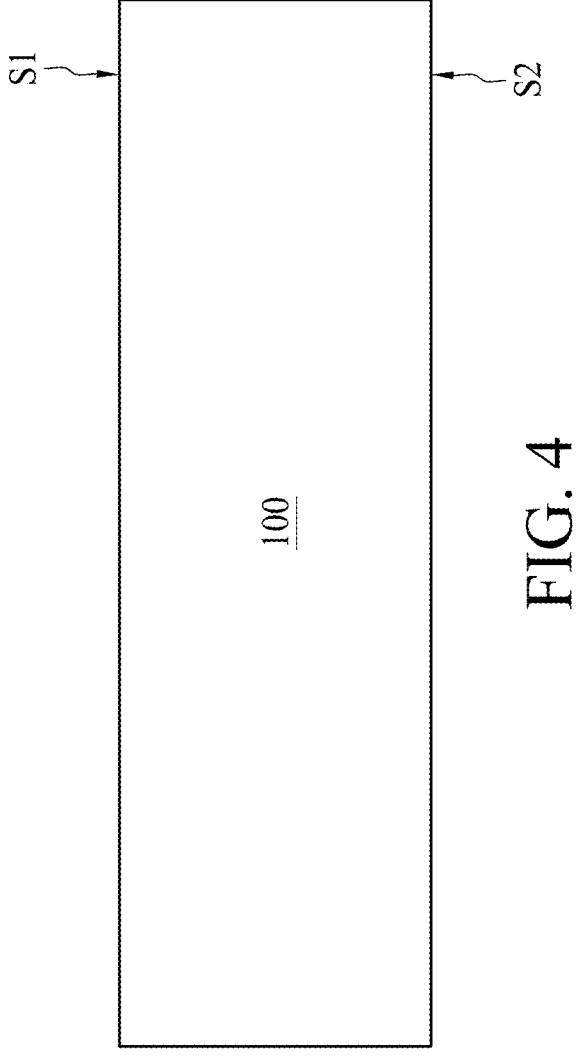
FIGS. 4 to 16C are schematic cross-sectional, top or bottom views illustrating sequential operations of the method shown in FIG. 3, in accordance with some embodiments of the present disclosure.

In operation 201 of FIG. 3, a substrate 100 is provided, as shown in FIG. 4. The substrate 100 may be a semiconductor substrate such as a bulk silicon wafer. In some embodiments, the substrate 100 is a semiconductor-on-insulator (SOI) substrate, a multi-layered or gradient substrate, or the like. The substrate 100 may include a semiconductor material such as Si, Ge, a compound or alloy semiconductor including SiC, SiGe, GaAs, GaP, GaAsP, AlInAs, AlGaAs, GaInAs, InAs, GaInP, InP, InSb, GaInAsP, or a combination thereof. The substrate 100 may be doped or undoped. In FIG. 4, the substrate 100 has a top surface S1 facing upward and a bottom surface S2 facing opposite to the top surface S1. The top surface 51 may be a front side surface of the substrate 100 on which multiple devices are to be formed. The bottom surface S2 may be a backside surface of the substrate 100. Although not specifically illustrated, multiple isolation structures may be formed in the substrate 100. The isolation structures may be shallow trench isolations (STIs). For example, the isolation structures may be trenches filled with an insulating material. Appropriate wells may be formed in the substrate 100. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100 using an implant mask.

Figure 5:
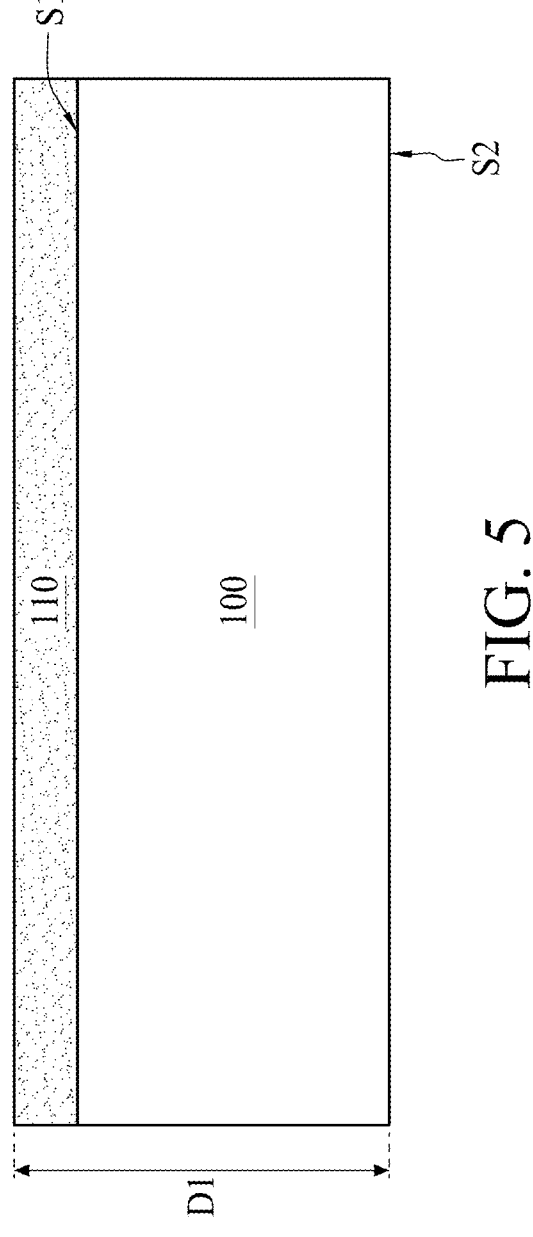

In operation 203 of FIG. 3, a device layer 110 is formed over the substrate 100, as shown in FIG. 5. Although not specifically illustrated, the device layer 110 may include multiple transistors surrounded by a dielectric layer disposed on the substrate 100. The transistors may be formed using a series of lithographic, etching, deposition, ion-implantation and planarization operations. The transistors are separated by the isolation structures in the substrate 100. Each transistor includes a gate structure and its corresponding source/drain structures. Each gate structure includes a gate dielectric layer surrounded by lightly doped source/drain (LDD) regions in the substrate 100. Each gate structure is surrounded by a gate spacer. The gate spacer at least covers portions of the LDD regions. The source/drain structures may include epitaxial features which are formed using an epitaxial growth operation such as metal-organic chemical vapor deposition (MOCVD), selective epitaxial growth (SEG), molecular-beam epitaxy (MBE), vapor-phase epitaxy (VPE), liquid-phase epitaxy (LPE), and/or other suitable methods. A silicide layer, such as cobalt silicide (CoSi), nickel silicide (NiSi) or tungsten silicide (WSi) may be formed on a top surface of each epitaxial feature. The silicide layer may be used to increase compatibility between a material of the epitaxial feature and a material of a conductive contact subsequently formed on the epitaxial feature. The silicide layer can reduce parasitic resistance or sheet resistance at a silicon/metal contact junction. Multiple conductive contacts may be respectively formed on the gate structure and the source/drain structures of each transistor. The conductive contacts may include one or more conductive materials, such as W, Cu, Co, Al, Ni, Ta, Ti, Mo, Pd, Pt, Ru, Ir, Ag, Au, TiN, TaN, the like, or a combination thereof. In some embodiments, a total thickness D1 of the device layer 110 and the substrate 100 is between about 1 millimeters (mm) and 3 mm.

Figure 6:
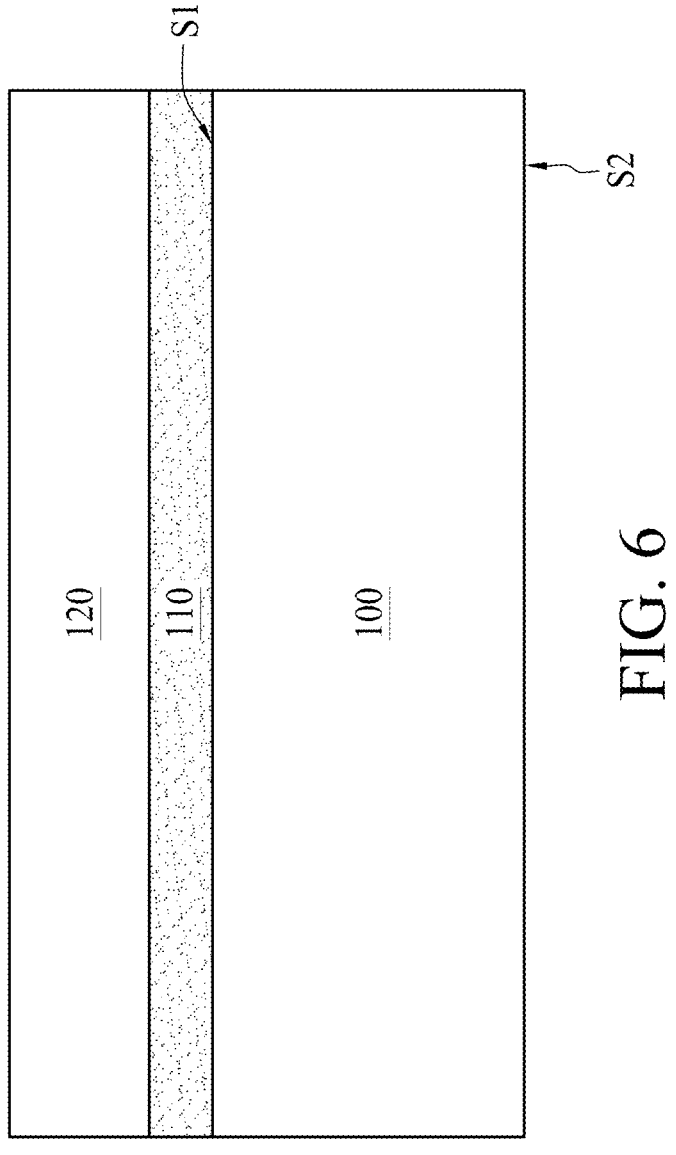

In operation 205 of FIG. 3, an interconnect layer 120 is formed over the device layer 110, as shown in FIG. 6. Although not specifically illustrated, the interconnect layer 120 may include multiple mutually connected conductive vias and conductive lines. The conductive vias and the conductive lines are embedded in one or more ILD layers or IMD layers. The conductive vias and the conductive lines may include one or more conductive materials, such as W, Cu, Co, Al, Ni, Ta, Ti, Mo, Pd, Pt, Ru, Ir, Ag, Au, TiN, TaN, the like, or a combination thereof. The dielectric material of the ILD layer or IMD layer may include silicon oxide, silicon nitride, undoped silicate glass (USG), phospho-silicate glass (PSG), boro-silicate glass (BSG), boron-doped phospho-silicate glass (BPS G), tetraethyl orthosilicate (TEOS), or other suitable materials. In some embodiments, the dielectric material of the ILD layer or IMD layer may include an extreme low-k (ELK) dielectric, which has a dielectric constant between 2.0 and 3.0. The conductive vias and the conductive lines may be formed using a series of lithographic, etching, deposition and planarization operations. The conductive vias and the conductive lines in the interconnect layer 120 may be electrically coupled to the transistors through the conductive contacts in the device layer 110.

Figure 7:
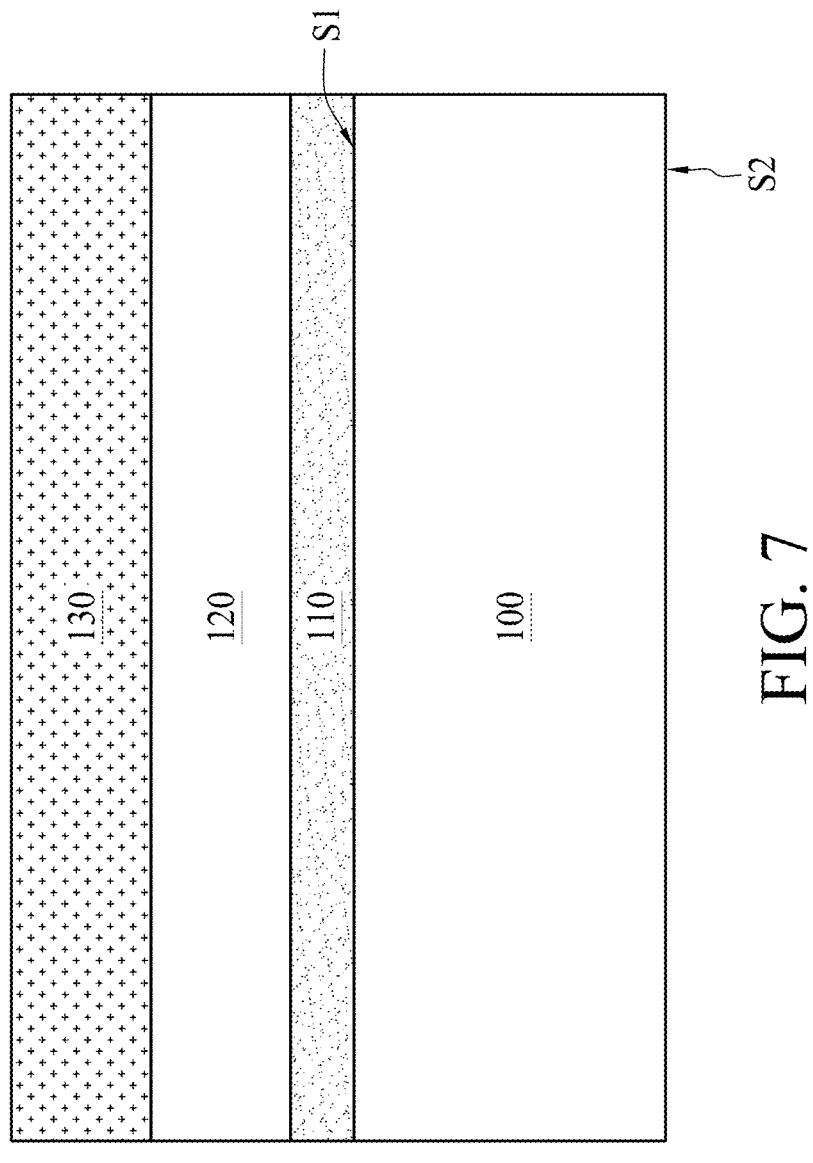

In operation 207 of FIG. 3, a luminous layer 130 is formed over the interconnect layer 120, as shown in FIG. 7. The luminous layer 130 may also be referred to as an optical device layer 120. Although not specifically illustrated, the luminous layer 130 may include multiple optical display devices such as an LCD device, an LED device, a micro LED device, an OLED device, a quantum dot display device, a light modulator, and the like. The optical display devices in the luminous layer 130 may be electrically coupled to the transistors through the conductive vias and the conductive lines in the interconnect layer 120 and the conductive contacts in the device layer 110.

Figure 8:
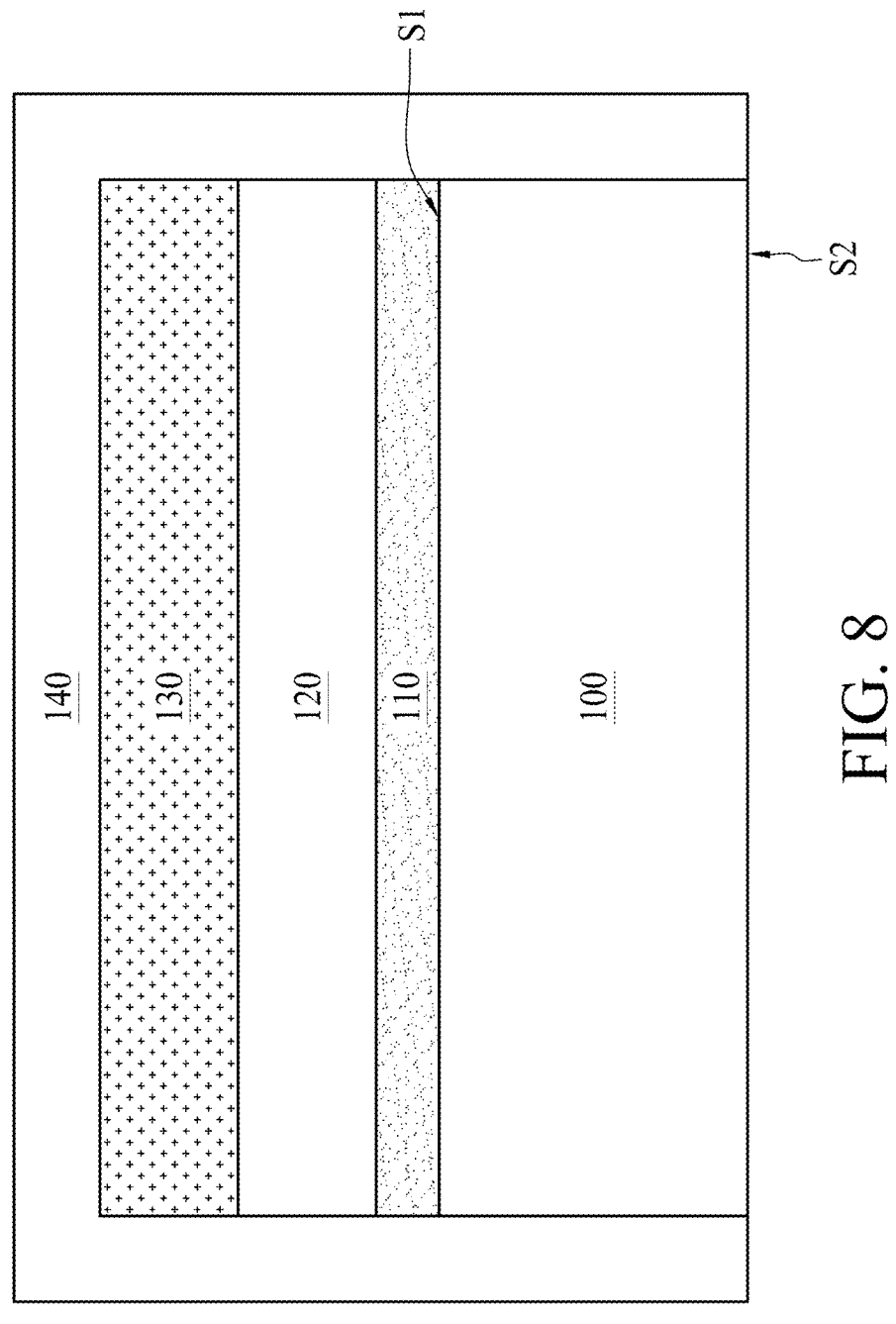

In operation 209 of FIG. 3, a protection layer 140 is formed over the luminous layer 130, the interconnect layer 120, the device layer 110 and the substrate 100, as shown in FIG. 8. The protection layer 140 may be formed of polyester resin, vinyl ester resin, epoxy resin or other suitable materials. In some embodiments, the protection layer 140 covers sidewalls of the luminous layer 130, the interconnect layer 120, the device layer 110 and the substrate 100. In some embodiments, the protection layer 140 does not cover the bottom surface S2 of the substrate 100.

Figure 9A:
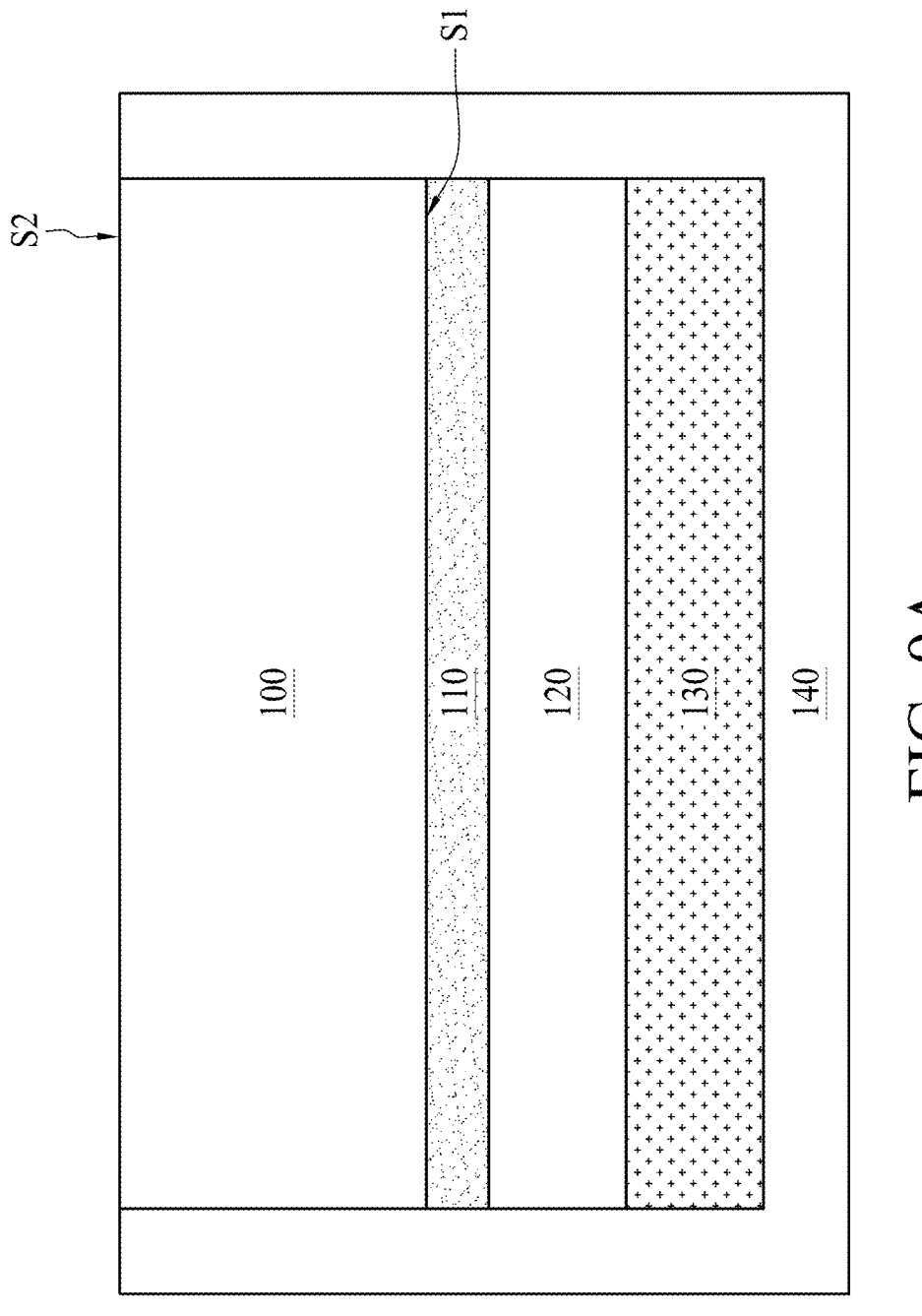
Figure 9B:
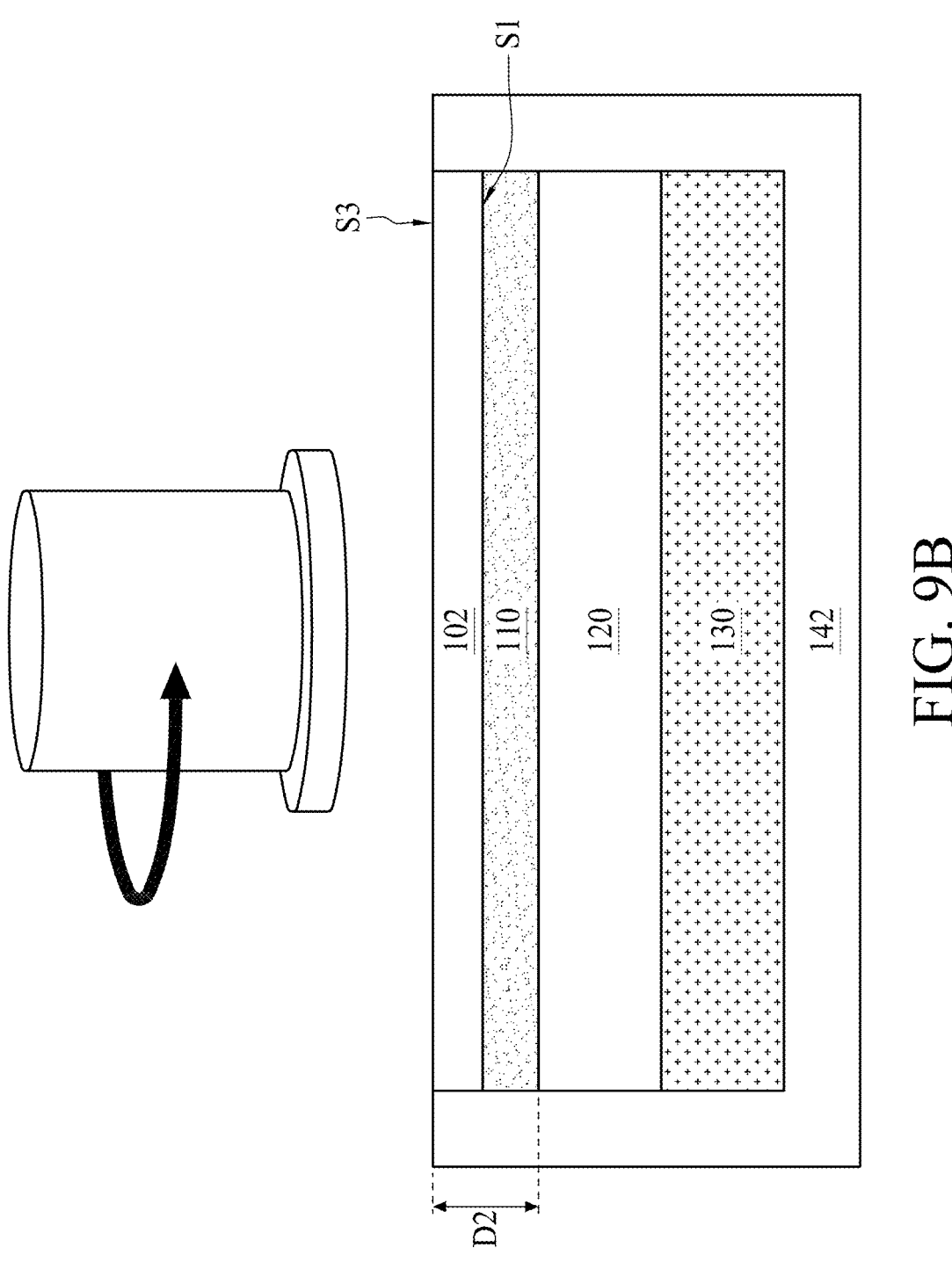

In operation 211 of FIG. 3, a grinding operation is performed on the bottom surface S2 of the substrate 100, as shown in FIGS. 9A and 9B. Referring to FIG. 9A, the substrate 100 is flipped, with the bottom surface S2 facing upward. Referring to FIG. 9B, portions of the substrate 100 and the protection layer 140 at the level of the bottom surface S2 are grinded. After the bottom surface S2 of the substrate 100 is grinded, the remaining substrate 100 and protection layer 140 may be respectively referred to as a substrate 102 and a protection layer 142. In some embodiments, a total thickness D2 of the device layer 110 and the substrate 102 is between about 10 micrometers (μm) and about 1000 μm. The substrate 102 has a bottom surface S3 facing upward and opposite to the top surface S1.

Figure 10A:
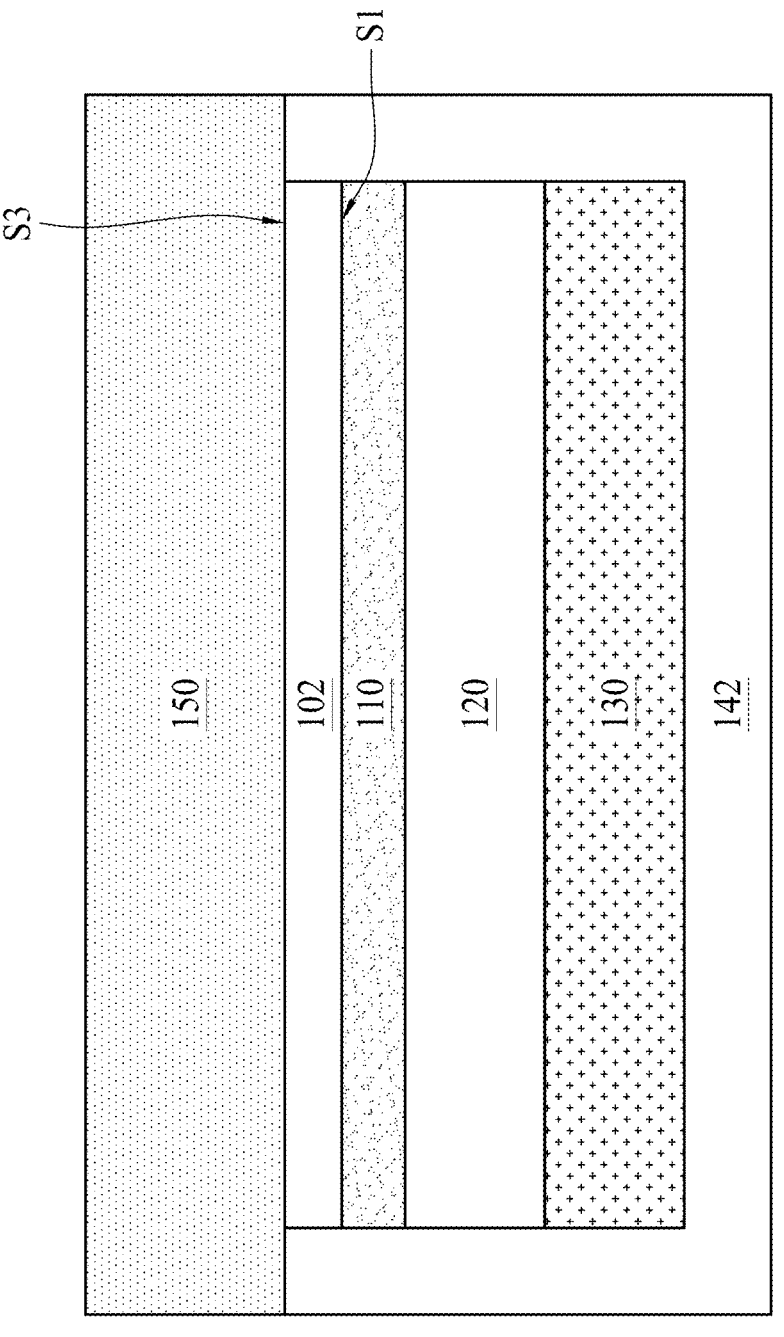

In operation 213 of FIG. 3, the substrate 102 is patterned to form multiple trenches T1, as shown in FIGS. 10A to 10E. Referring to FIG. 10A, a photoresist layer 150 is coated on the bottom surface S3 of the substrate 102 and a portion of the protection layer 142.

Figure 10B:
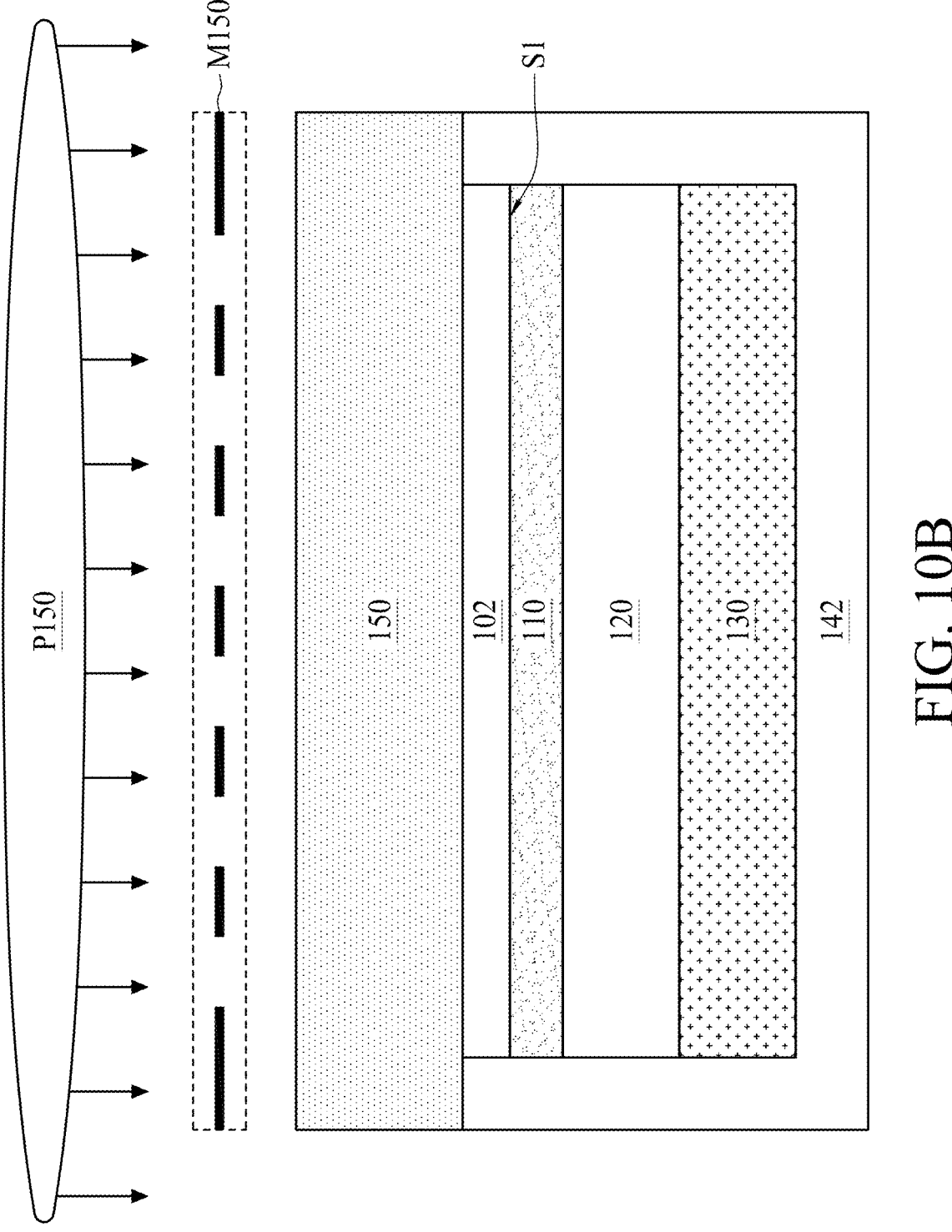

Referring to FIG. 10B, the photoresist layer 150 is exposed to a radiation P150 such as a deep ultraviolet (DUV) light or an extreme ultraviolet (EUV) light through a photomask M150. Subsequently, a developing agent is applied to the exposed the photoresist layer 150.

Figure 10C:
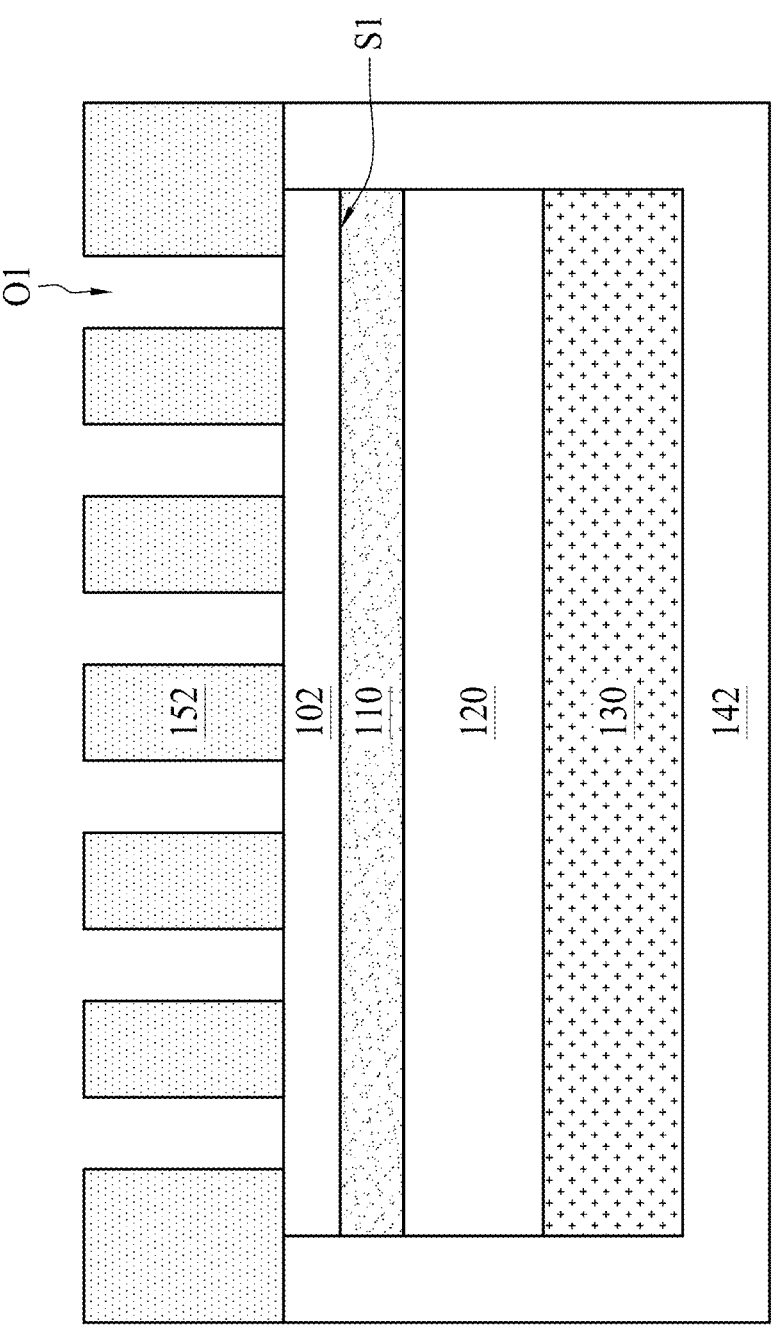

Referring to FIG. 10C, after development, the exposed photoresist layer 150 forms a patterned photoresist layer 152 that remains on the substrate 102. The patterned photoresist layer 152 may have multiple openings O1 exposing portions of the substrate 102.

Figure 10D:
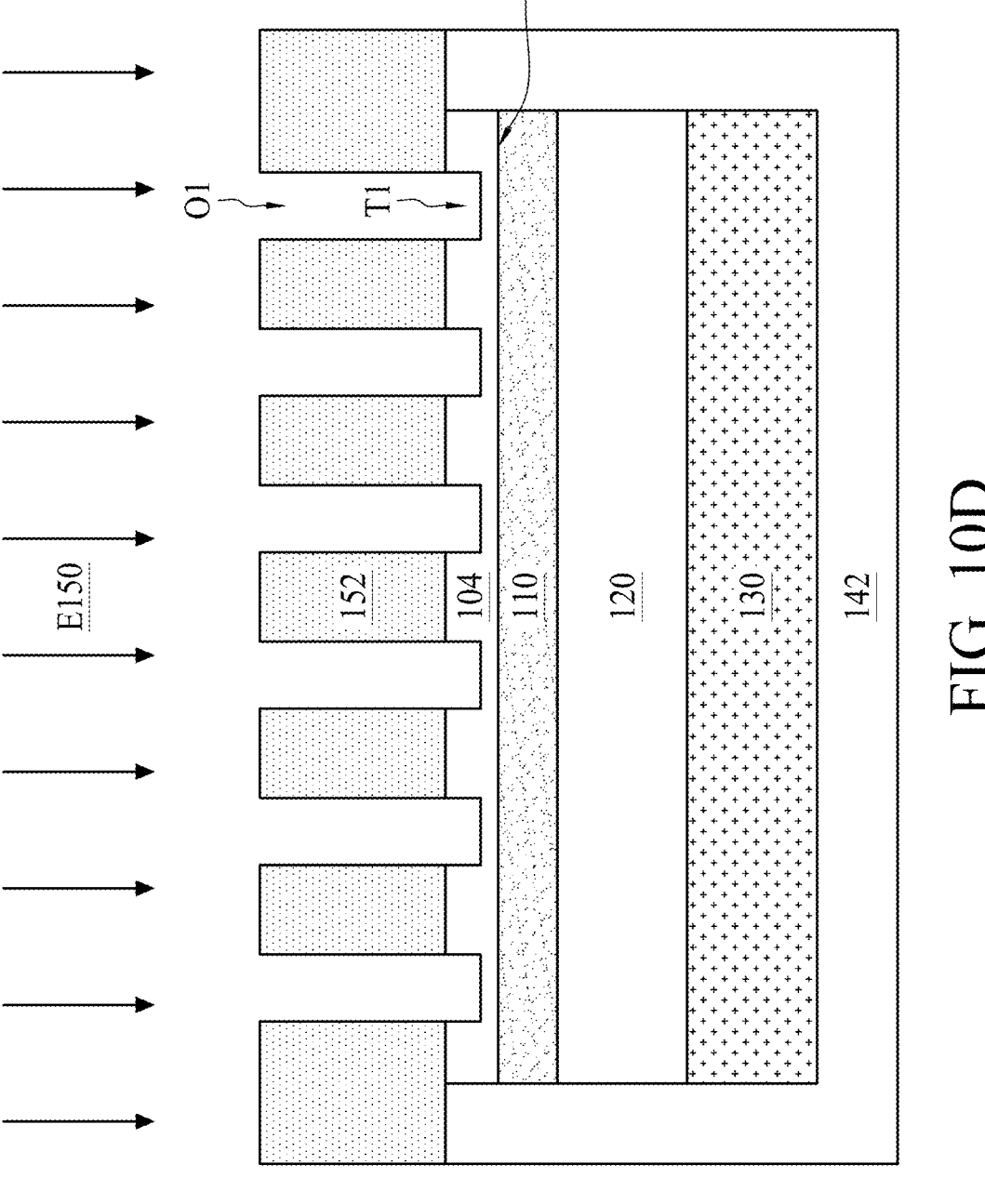

Referring to FIG. 10D, an etching operation E150 is performed on the substrate 102 using the patterned photoresist layer 152 as an etching mask. The etching operation E1 may include reactive ion etch (RIE), dry etch, or other suitable operations. Portions of the substrate 102 exposed by the openings O1 may be removed to form the trenches T1. The trenches T1 do not penetrate the substrate 102. After the substrate 102 is patterned, the remaining substrate 102 may be referred to as a substrate 104.

Figure 10E:
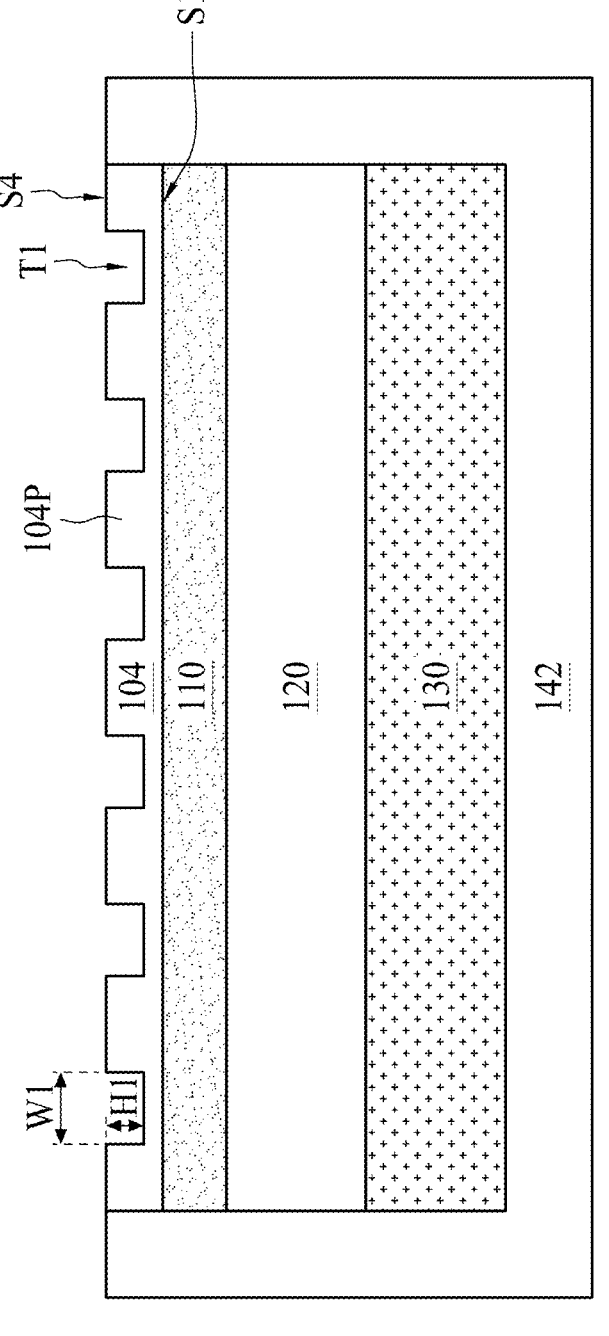

Referring to FIG. 10E, after the trenches T1 are formed, multiple protrusions 104P are formed on the substrate 104. The protrusions 104P may be alternately arranged with the trenches T1. The substrate 104 has a bottom surface S4 facing upward and opposite to the top surface S1. In some embodiments, the protrusions 104P are formed on the bottom surface S4. Subsequently, the patterned photoresist layer 152 may be stripped using a wet clean operation, an ashing operation, or other suitable operations. After the patterned photoresist layer 152 is removed, the protrusions 104P are exposed. In some embodiments, each of the trenches T1 has a depth H1 between about 5 nanometers (nm) and about 50 μm. In some embodiments, each of the trenches T1 has a width W1 between about 5 nm and about 50 μm.

Figure 11:
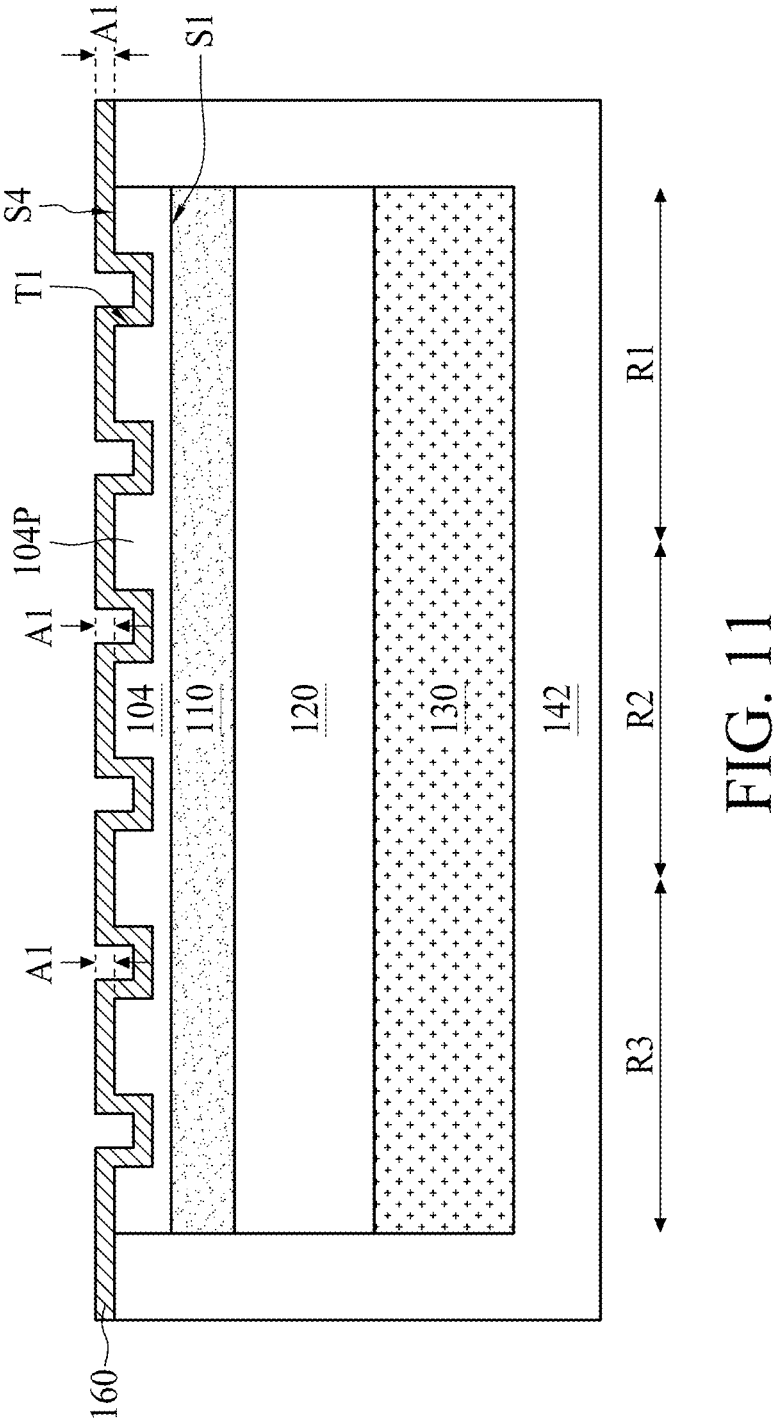

In operation 215 of FIG. 3, a capping layer 160 is formed in the trenches T1 of the substrate 104 and a portion of the protection layer 142, as shown in FIG. 11. In some embodiments, the capping layer 160 is conformally formed along the trenches T1, the protrusions 104P and the bottom surface S4 of the substrate 104. The capping layer 160 may completely cover the bottom surface S4 of the substrate 104. The capping layer 160 may be formed using a deposition operation such as atomic layer deposition (ALD), chemical vapor deposition (CVD) or other suitable methods. In some embodiments, the capping layer 160 is formed of silicon nitride (SiN). The trenches T1 are not filled by the capping layer 160. In some embodiments, the capping layer 160 has a thickness A1 between about 5 Å and about 100 nm. The capping layer 160 may be divided into multiple portions corresponding to a first region R1, a second region R2 and a third region R3 over the substrate 100. These portions will be given reference numerals in following figures. These portions will be separately or simultaneously etched to have different thicknesses in subsequent operations.

Figure 12A:
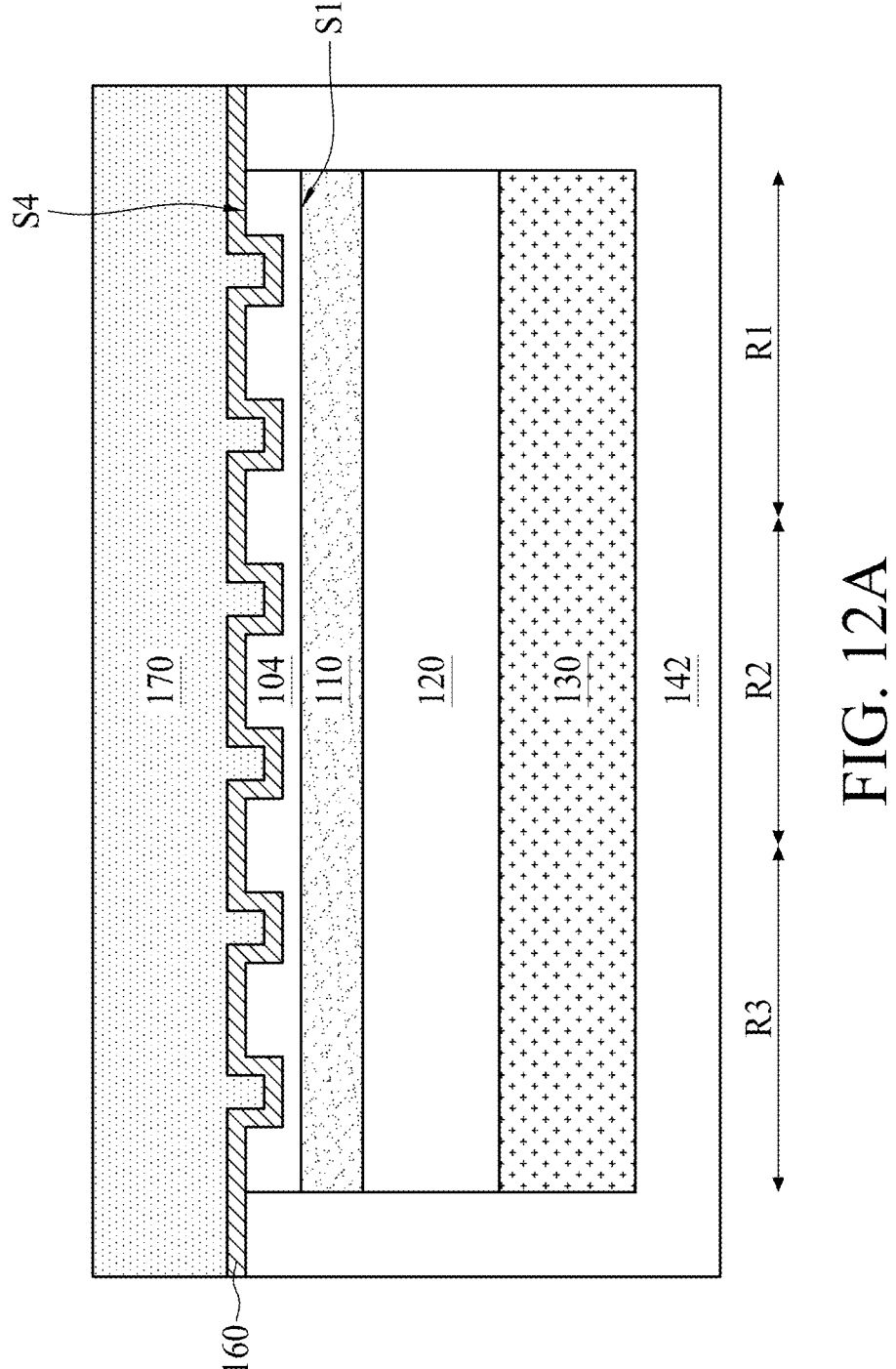

In operation 217 of FIG. 3, a first patterning operation is performed on the capping layer 160, as shown in FIGS. 12A to 12E. Referring to FIG. 12A, a photoresist layer 170 is coated on the capping layer 160.

Figure 12B:
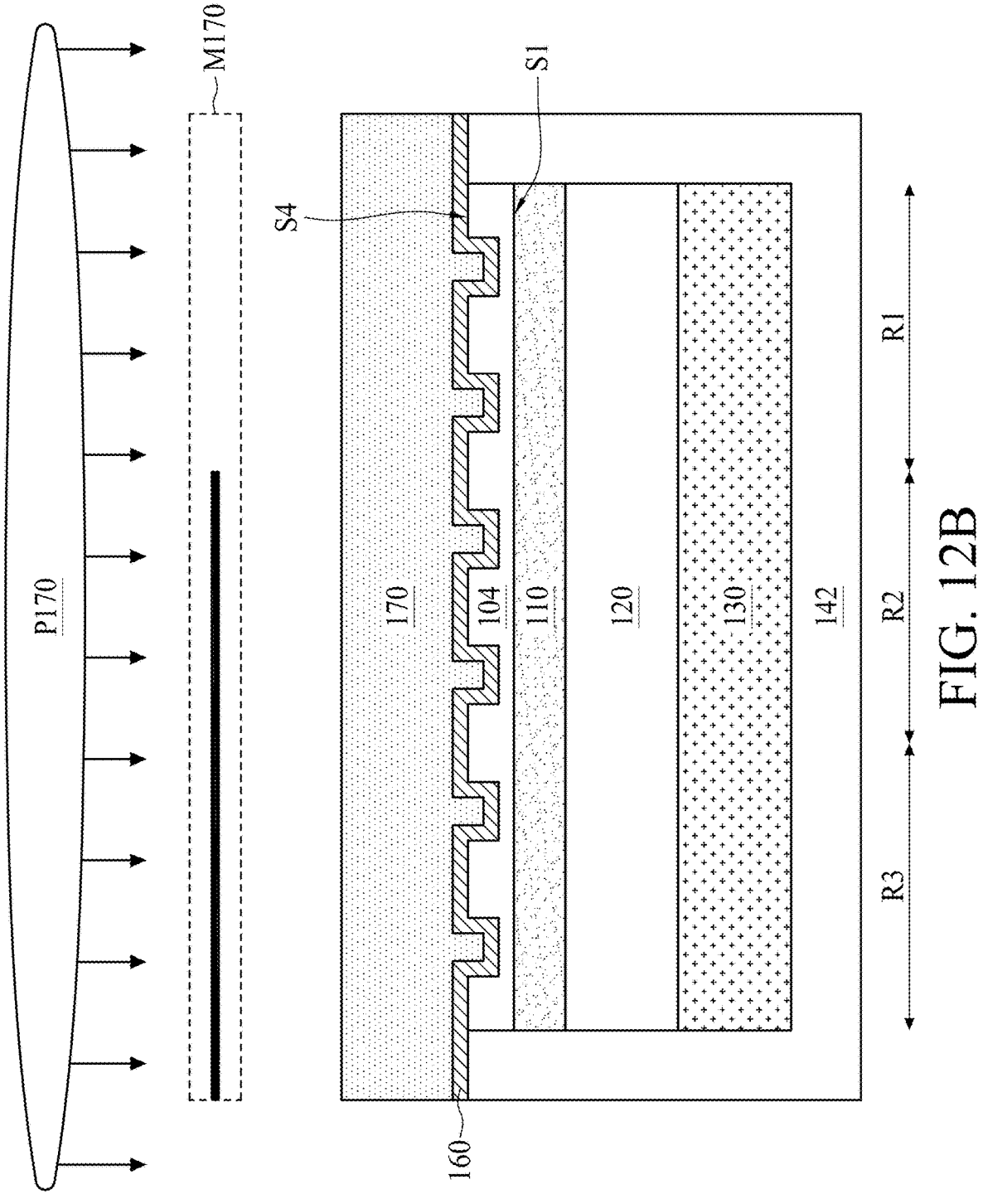

Referring to FIG. 12B, the photoresist layer 170 is exposed to a radiation P170 such as a DUV light or an EUV light through a photomask M170. Subsequently, a developing agent is applied to the exposed the photoresist layer 170.

Figure 12C:
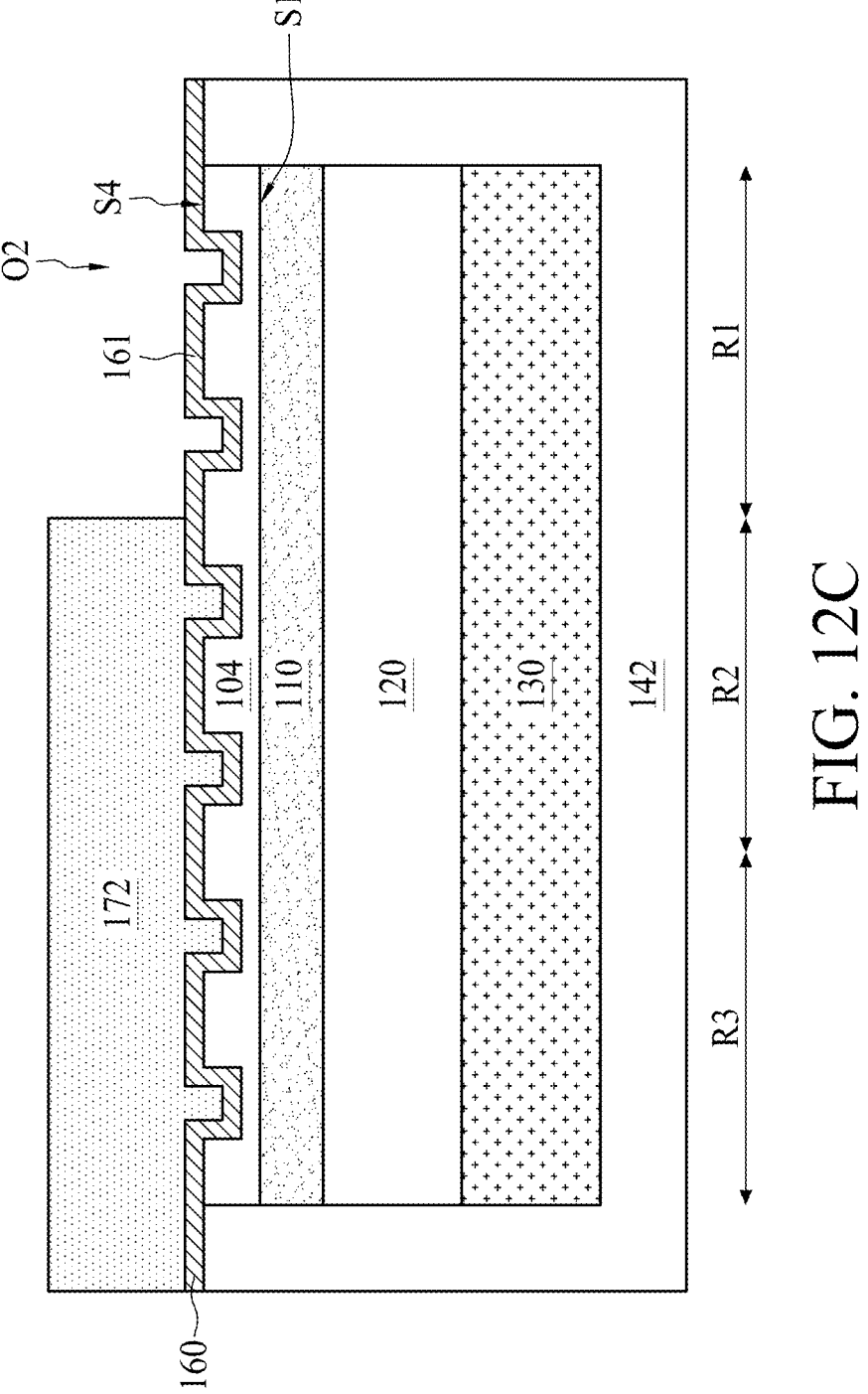

Referring to FIG. 12C, after development, the exposed photoresist layer 170 forms a patterned photoresist layer 172 that remains on the capping layer 160. In some embodiments, the patterned photoresist layer 172 has an opening O2 exposing a first portion 161 of the capping layer 160 corresponding to the first region R1.

Figure 12D:
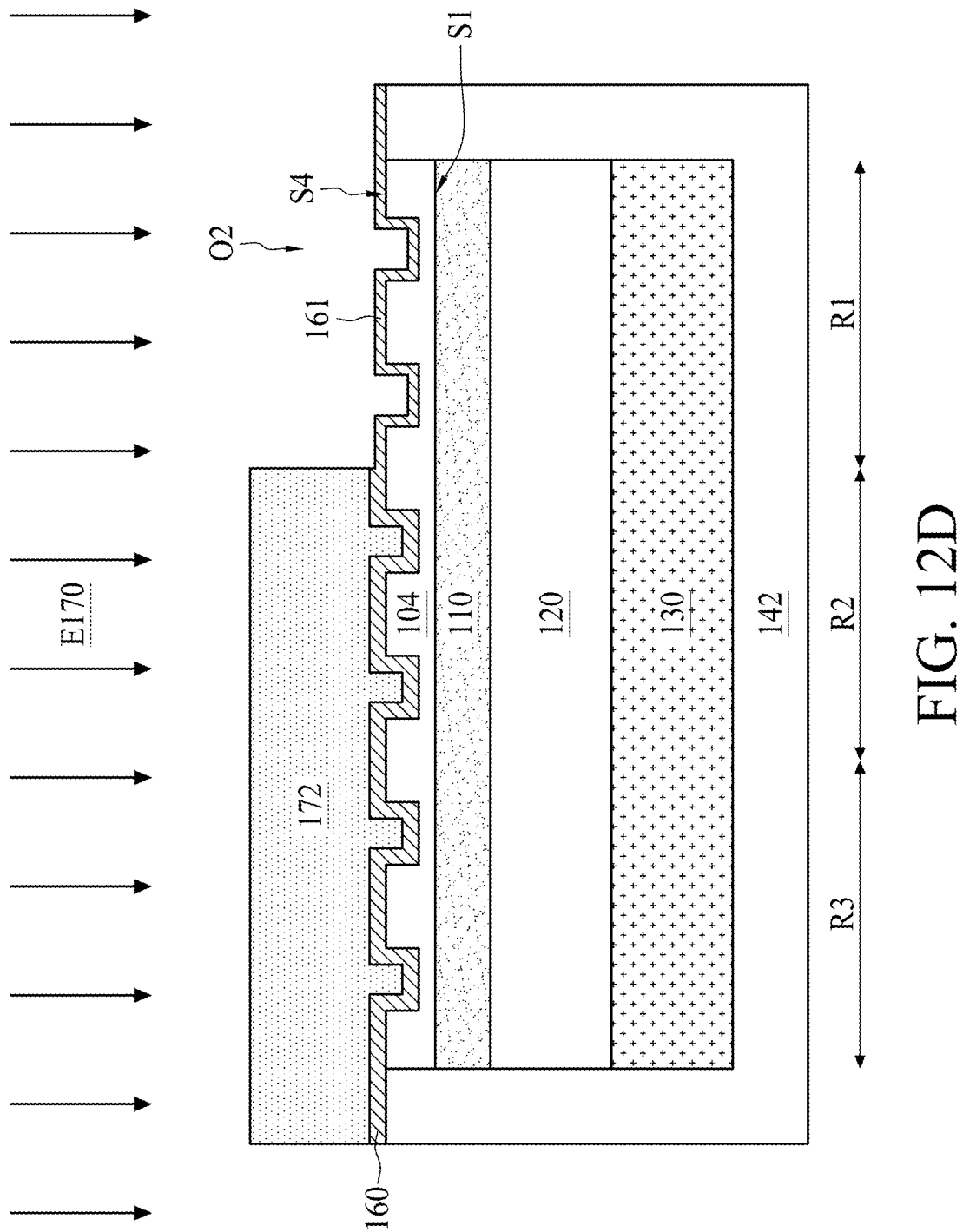

Referring to FIG. 12D, an etching operation E170 is performed on the capping layer 160 using the patterned photoresist layer 172 as an etching mask. The etching operation E170 may include RIE, dry etch, or other suitable operations. In some embodiments, during the etching operation E170, the first portion 161 of the capping layer 160 corresponding to the first region R1 is trimmed.

Figure 12E:
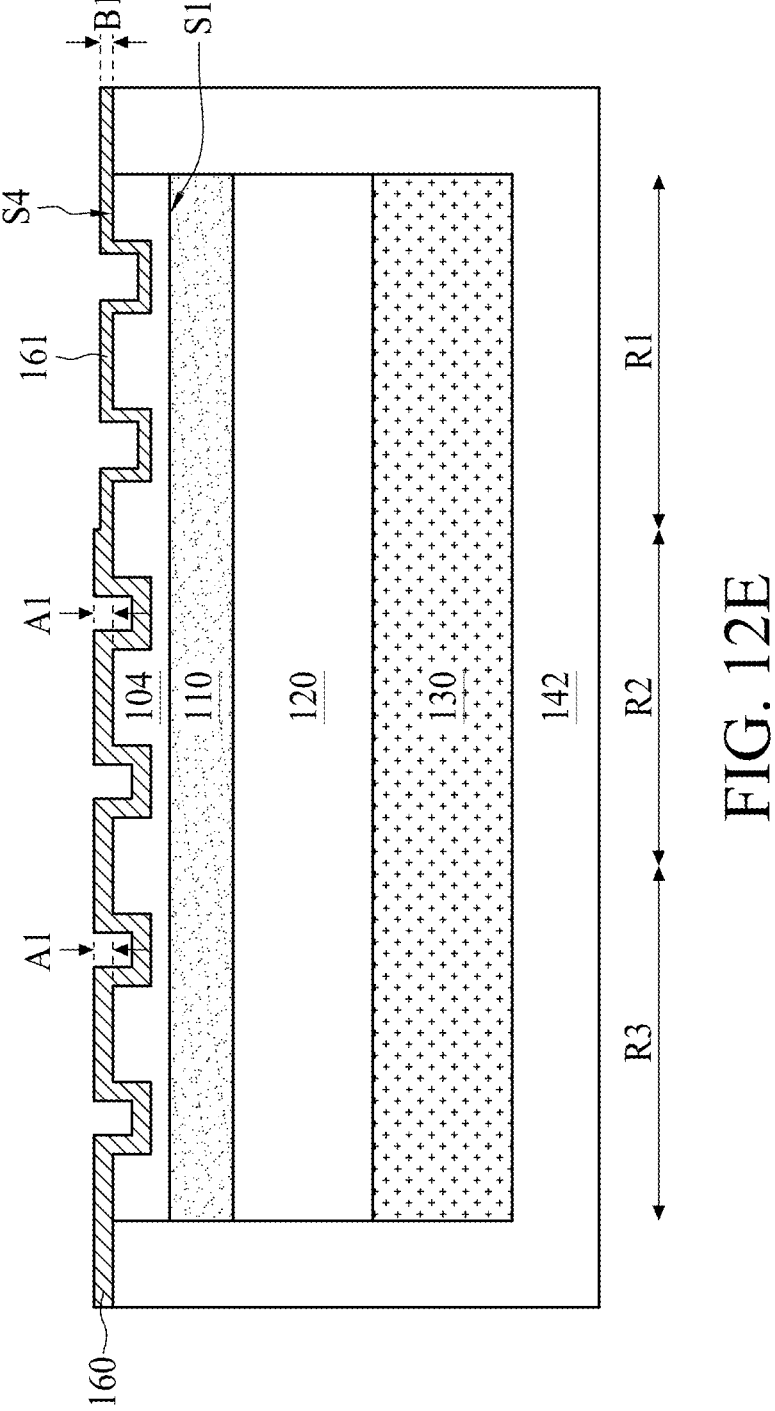

Referring to FIG. 12E, after the etching operation E170, the patterned photoresist layer 172 may be stripped using a wet clean operation, an ashing operation, or other suitable operations. In some embodiments, the trimmed first portion 161 of the capping layer 160 has a thickness B1 less than the thickness A1.

Figure 13A:
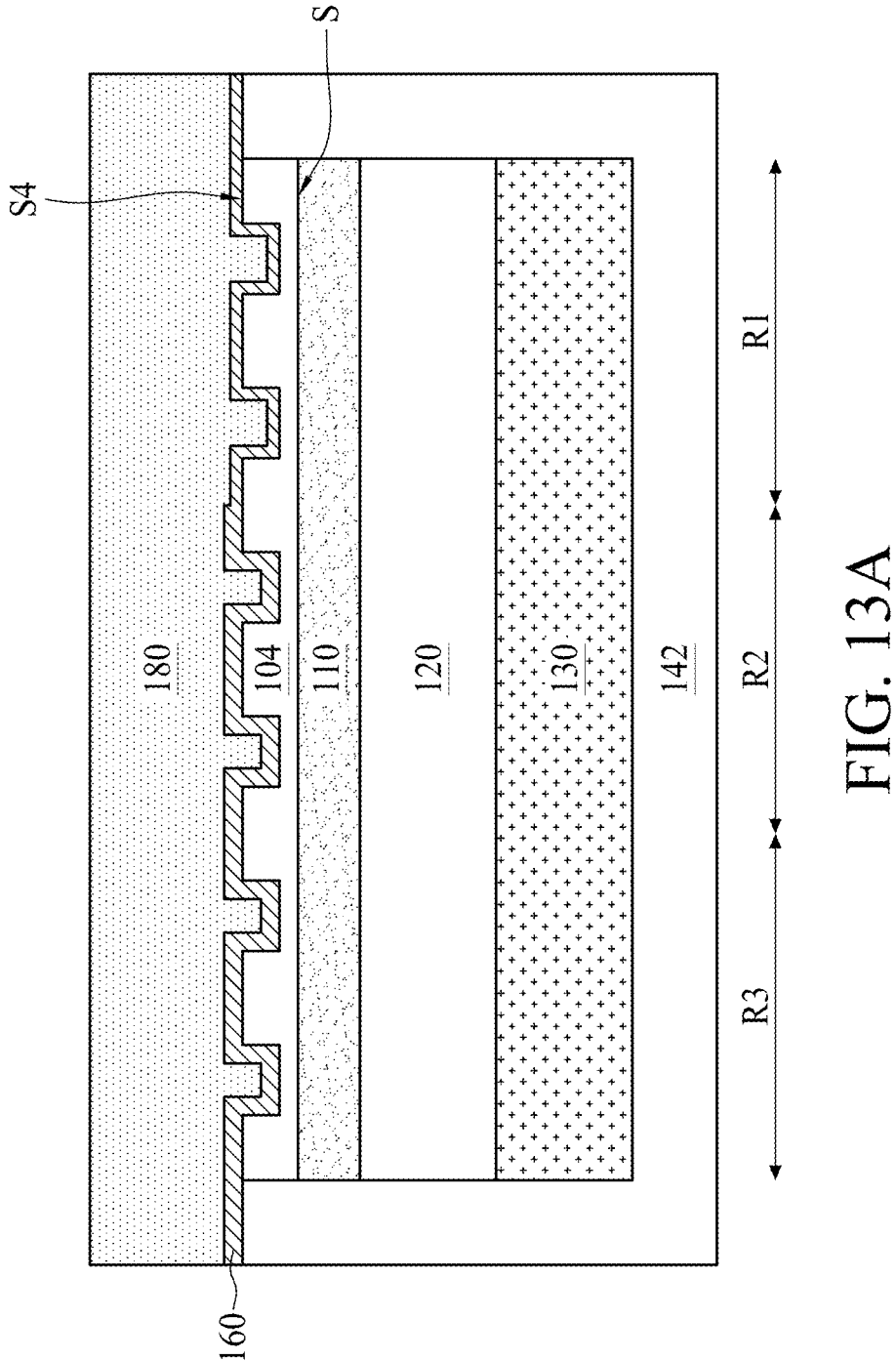

In operation 219 of FIG. 3, a second patterning operation is performed on the capping layer 160, as shown in FIGS. 13A to 13E. Referring to FIG. 13A, a photoresist layer 180 is coated on the capping layer 160.

Figure 13B:
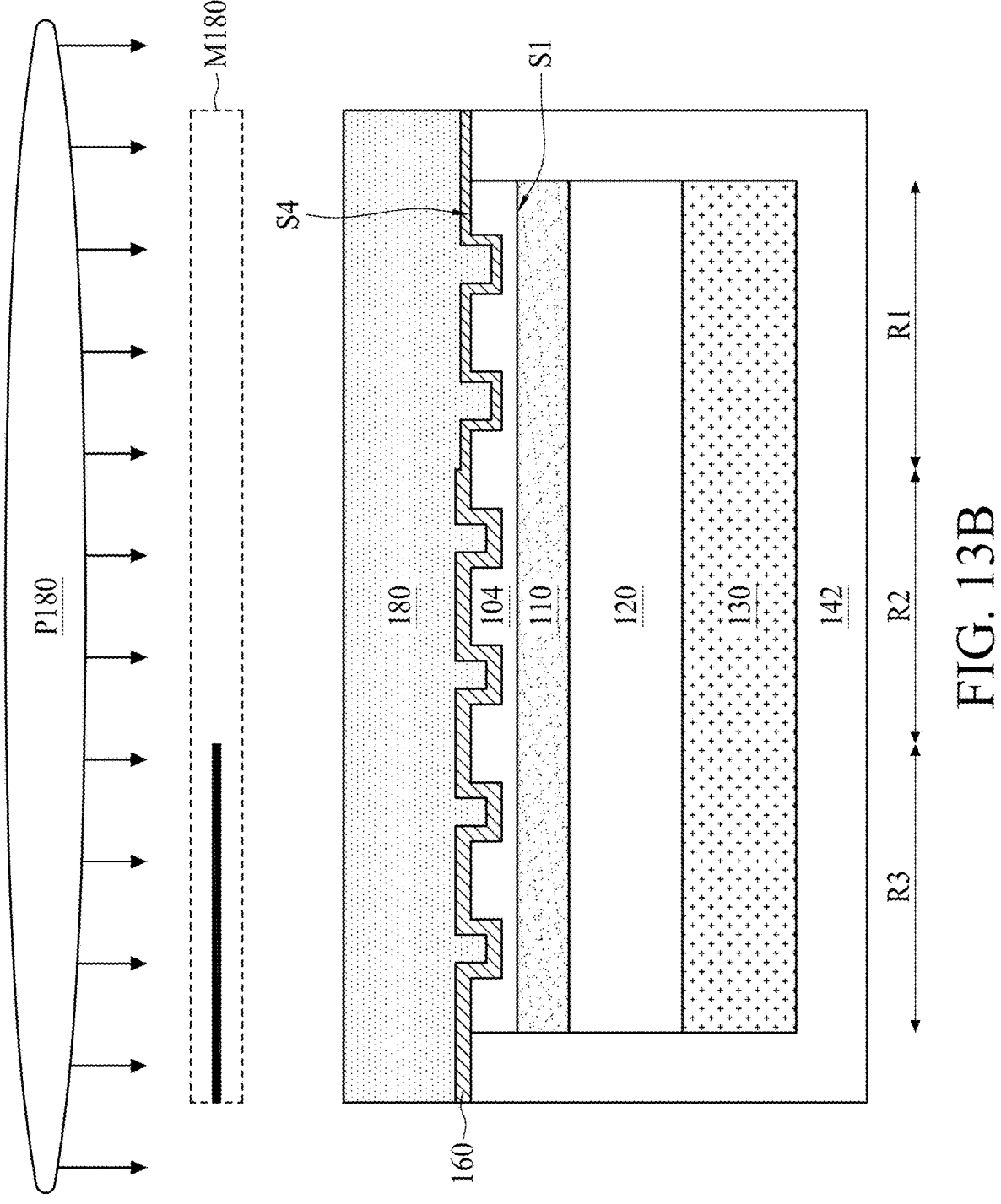

Referring to FIG. 13B, the photoresist layer 180 is exposed to a radiation P180 such as a DUV light or an EUV light through a photomask M180. In some embodiments, the photomask M180 has a layout different from a layout of the photomask M170. Subsequently, a developing agent is applied to the exposed the photoresist layer 180.

Figure 13C:
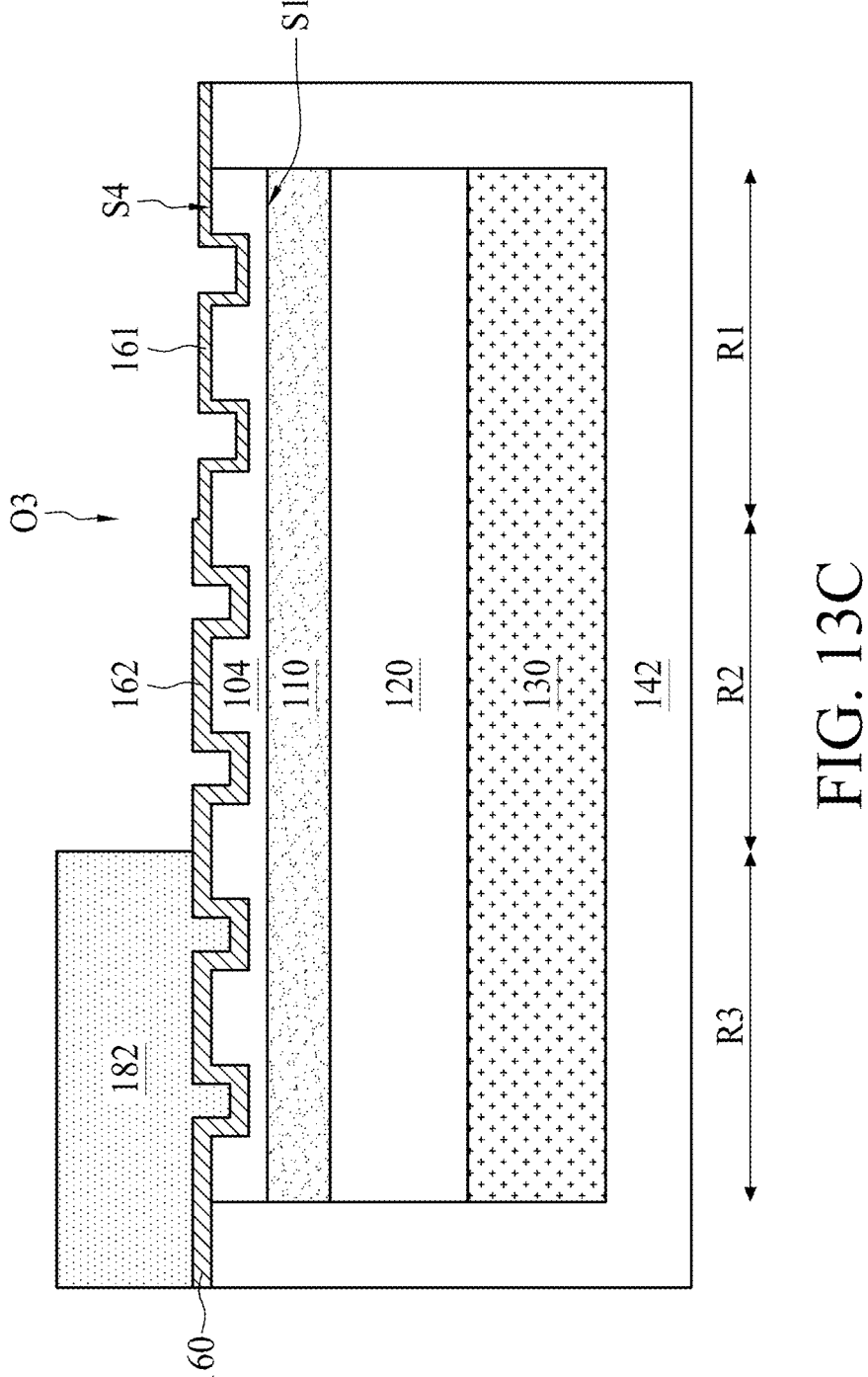

Referring to FIG. 13C, after development, the exposed photoresist layer 180 forms a patterned photoresist layer 182 that remains on the capping layer 160. In some embodiments, the patterned photoresist layer 182 has an opening O3 exposing a second portion 162 of the capping layer 160 corresponding to the second region R2 and the first portion 161 of the capping layer 160 corresponding to the first region R1.

Figure 13D:
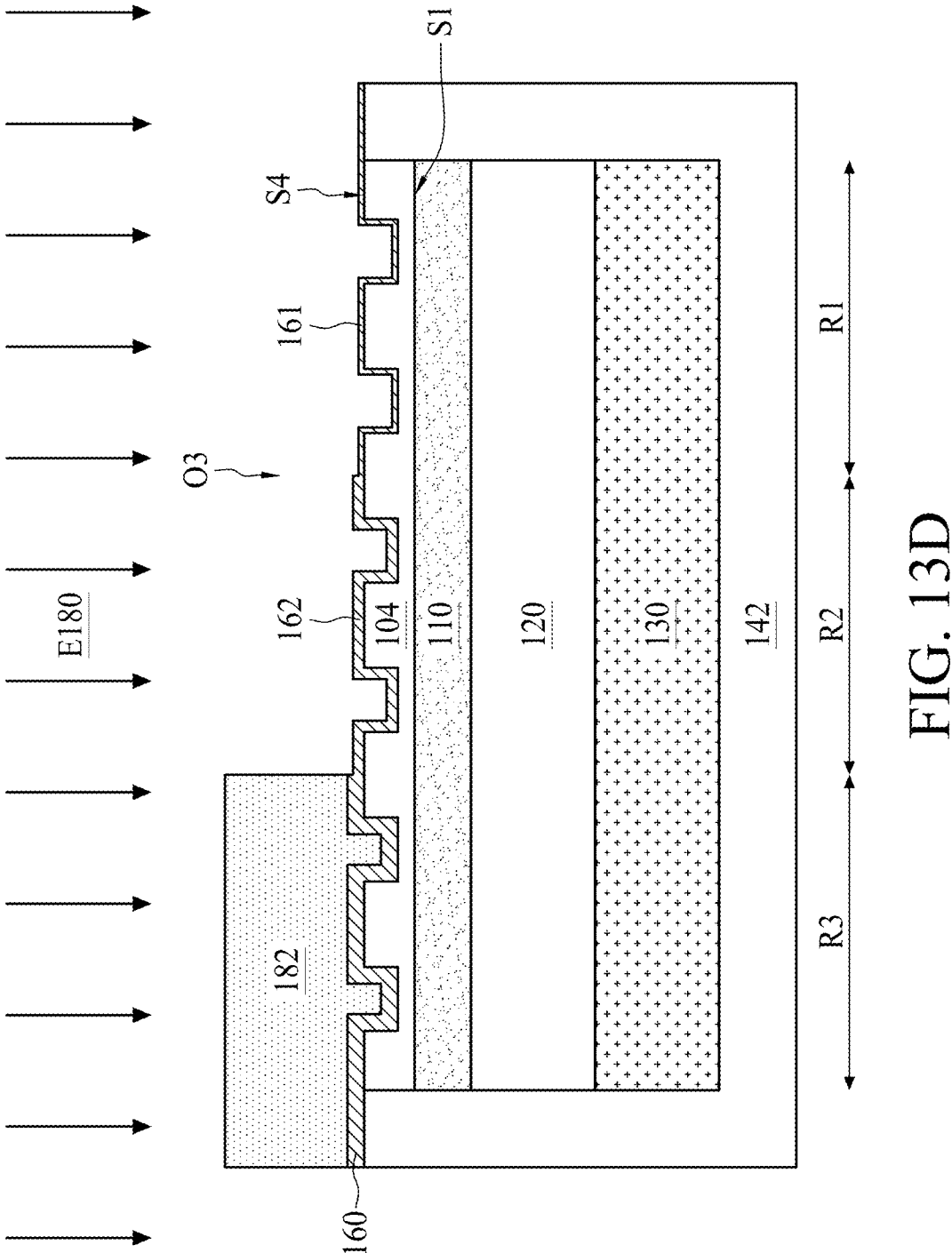

Referring to FIG. 13D, an etching operation E180 is performed on the capping layer 160 using the patterned photoresist layer 182 as an etching mask. The etching operation E180 may include RIE, dry etch, or other suitable operations. In some embodiments, during the etching operation E180, the second portion 162 of the capping layer 160 corresponding to the second region R2 is trimmed. In some embodiments, during the etching operation E180, the first portion 161 of the capping layer 160 corresponding to the first region R1 is trimmed at a second time.

Figure 13E:
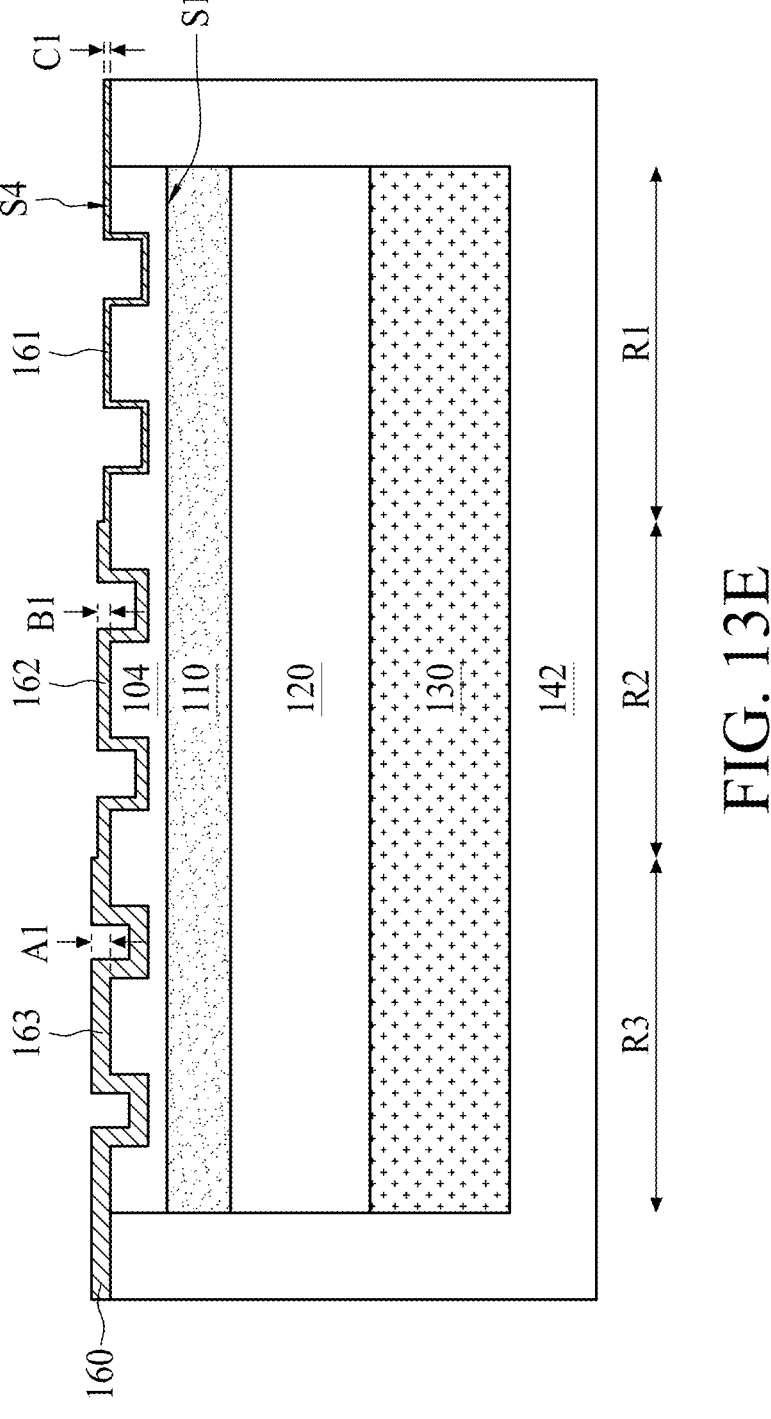

Referring to FIG. 13E, after the etching operation E180, the patterned photoresist layer 182 may be stripped using a wet clean operation, an ashing operation, or other suitable operations. The untrimmed portion of the capping layer 160 corresponds to the third region R3 and may be referred as a third portion 163. In some embodiments, the third portion 163 has the thickness A1. In some embodiments, the trimmed second portion 162 of the capping layer 160 has a thickness B1 less than the thickness A1. In some embodiments, the trimmed first portion 161 of the capping layer 160 has a thickness C1 less than the thickness B1. That is, the capping layer 160 may have an inconsistent thickness along the bottom surface S4 of the substrate 104.

Figure 14A:
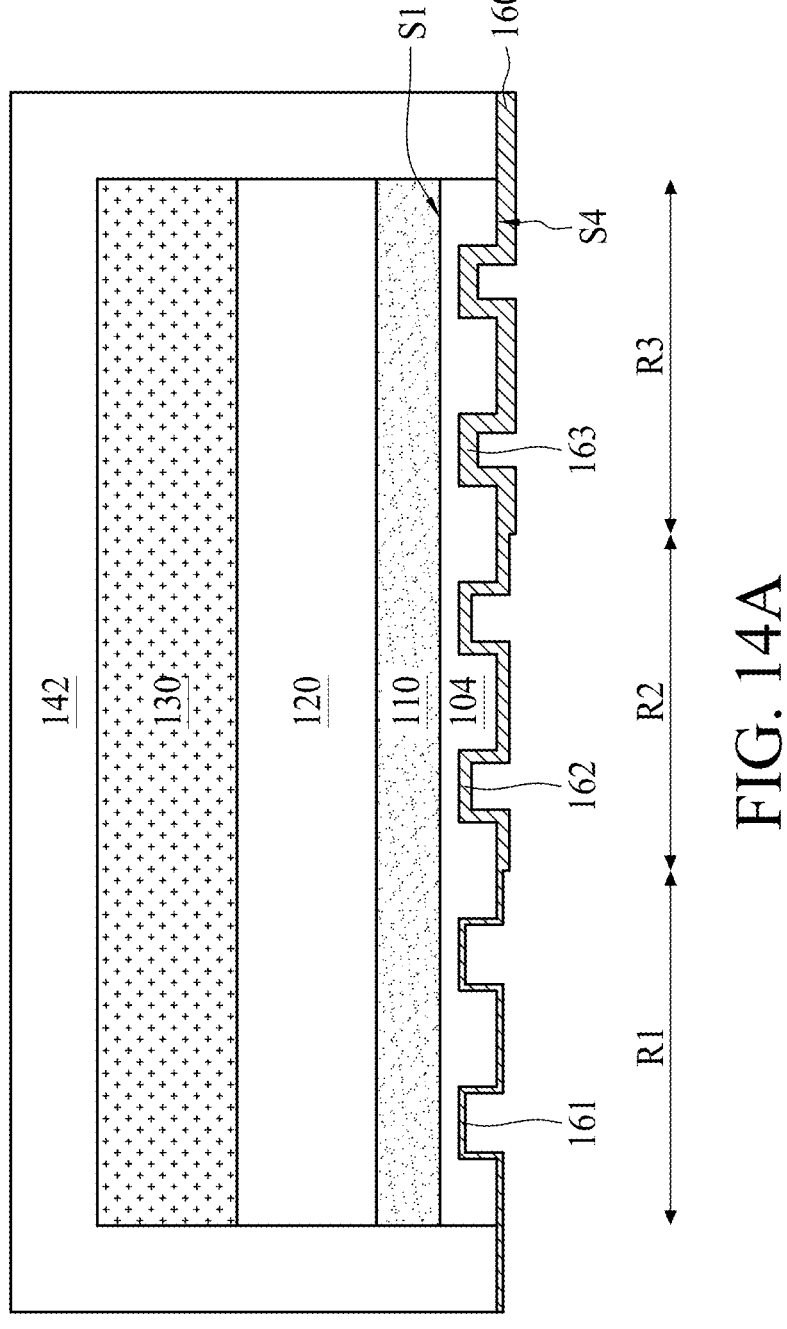
Figure 14B:
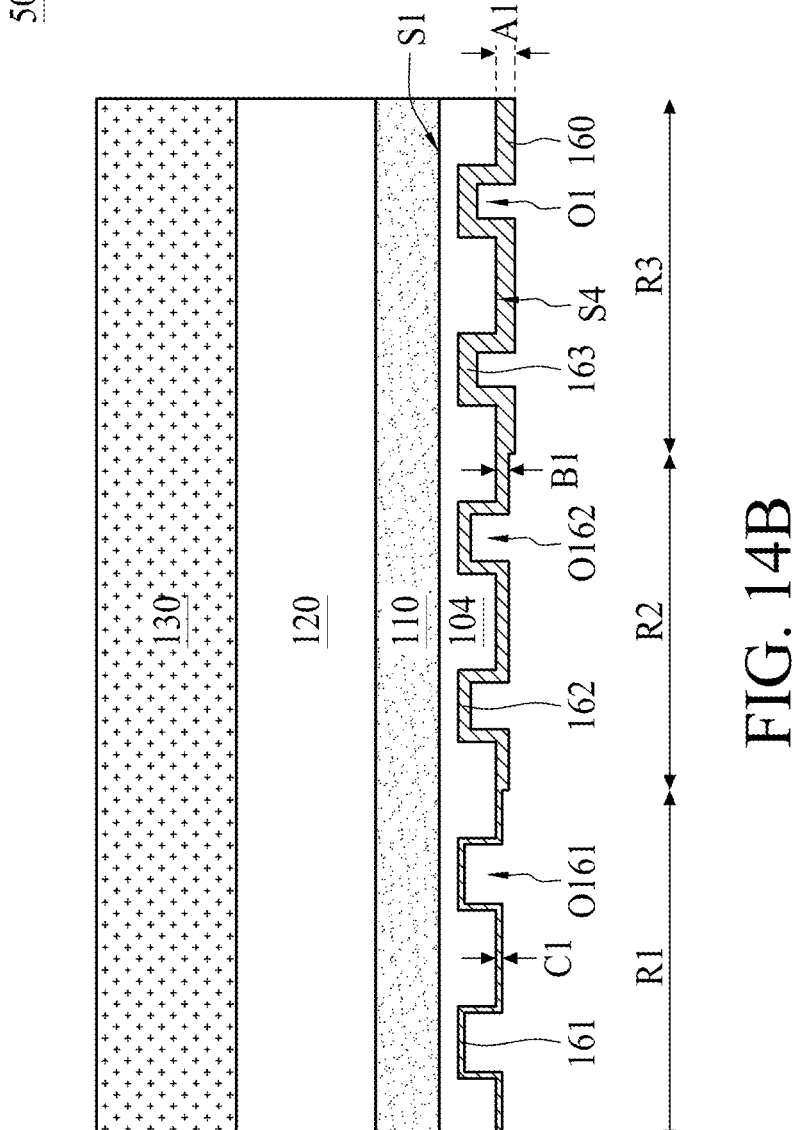
Figure 14C:
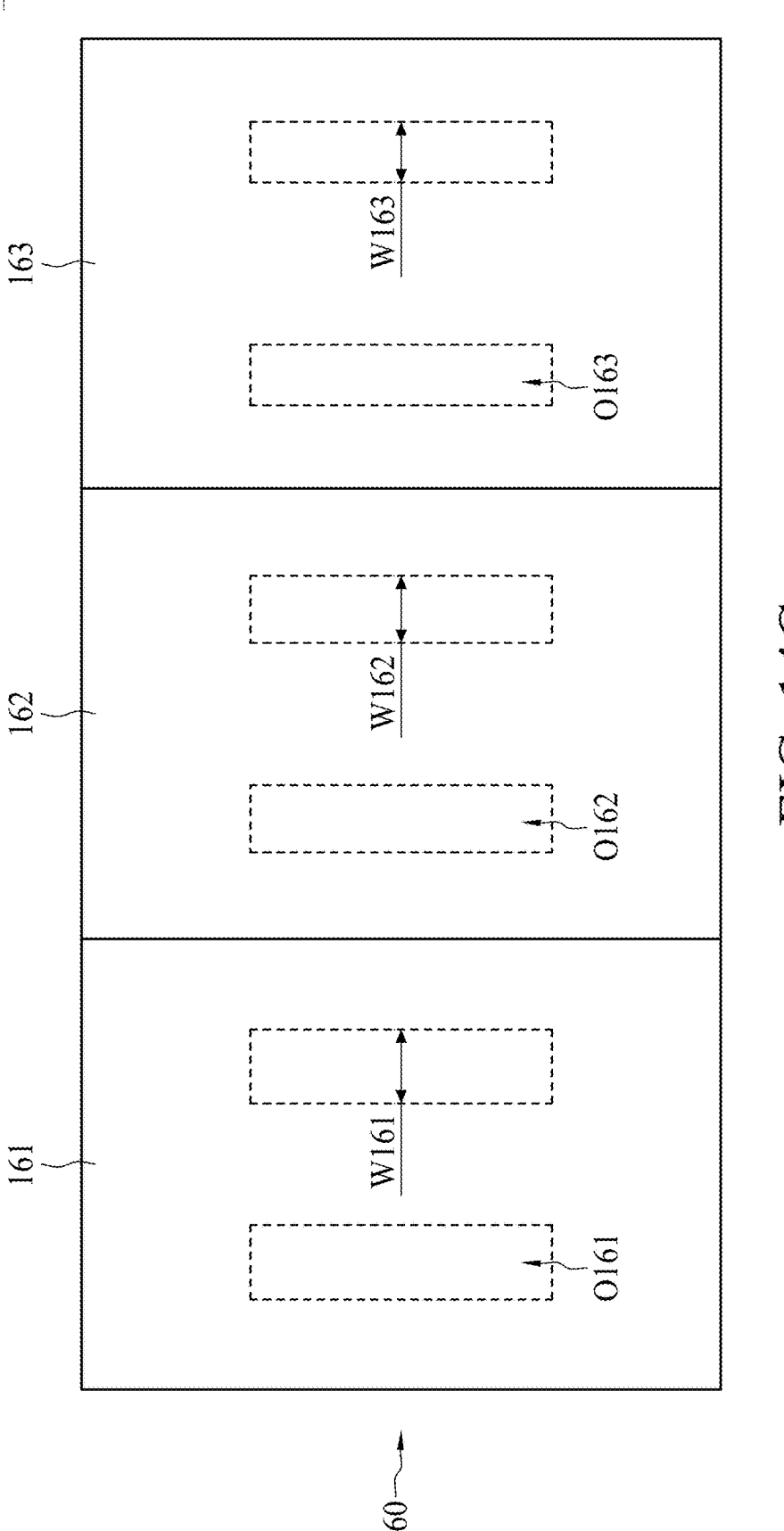

In operation 221 of FIG. 3, the protection layer 142 is removed to complete a semiconductor device 50, as shown in FIGS. 14A to 14C. Referring to FIG. 14A, the substrate 104 is flipped, with the top surface S1 facing upward.

Referring to FIG. 14B, the protection layer 142 and portions of the capping layer 160 on the protection layer 142 are removed using a wet clean operation, an ashing operation, or other suitable operations. At this stage, the semiconductor device 50 is complete. In the semiconductor device 50, the device layer 110 is formed on the top surface S1 of the substrate 104. The interconnect layer 120 is formed on the device layer 110. The luminous layer 130 is formed on the interconnect layer 120. The capping layer 160 is formed on the other surface of the substrate 104 opposite to the top surface S1. The semiconductor device 50 includes the regions R1, R2 and R3. The capping layer 160 includes the first portion 161 corresponding to the first region R1, the second portion 162 corresponding to the second region R2 and the third portion 163 corresponding to the third region R3. The portions 161, 162 and 163 of the capping layer 160 may have different thicknesses. Also referring to FIG. 13E, in some embodiments, the thickness A1 of the third portion 163 is greater than the thickness B1 of the second portion 162, and the thickness B1 of the second portion 162 is greater than the thickness C1 of the first portion 161. In some embodiment, the first portion 161 surrounds one or more openings O161 in the first region R1, the second portion 162 surrounds one or more openings O162 in the second region R2 and the third portion 163 surrounds one or more openings O163 in the third region R3.

Referring to FIG. 14C, which is a schematic bottom view of the semiconductor device 50. In some embodiments, the opening O161 has a width W161, the opening O162 has a width W162 and the opening O163 has a width W163. In some embodiments, the width W161 is greater than the width W162. In some embodiments, the width W162 is greater than the width W163. In some embodiments, the openings O161, O162 and O163 have a triangular, square, circular, rectangular, pentagonal or hexagonal profile from the bottom view or from a top view.

Figure 15A:
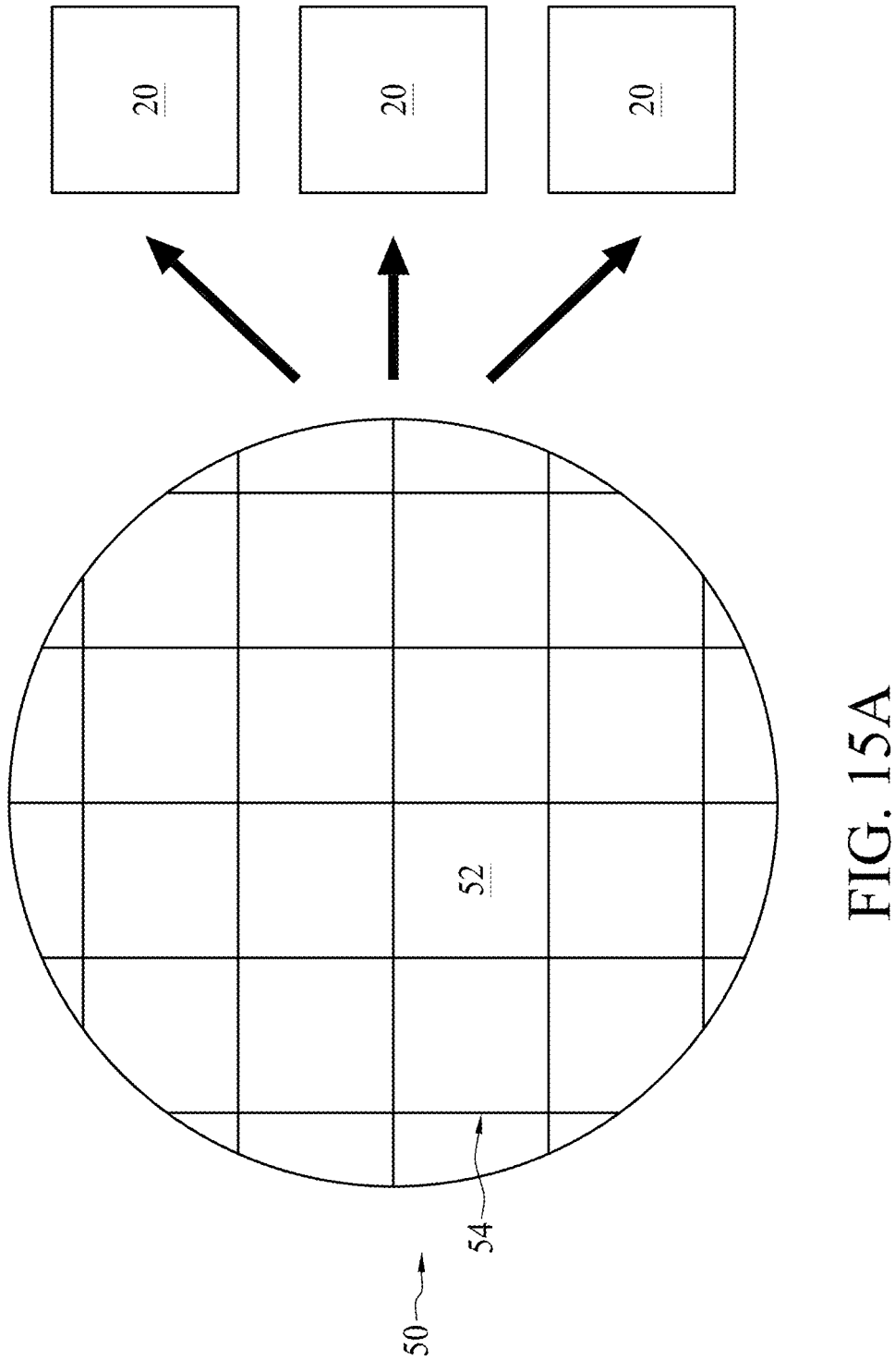
Figure 15B:
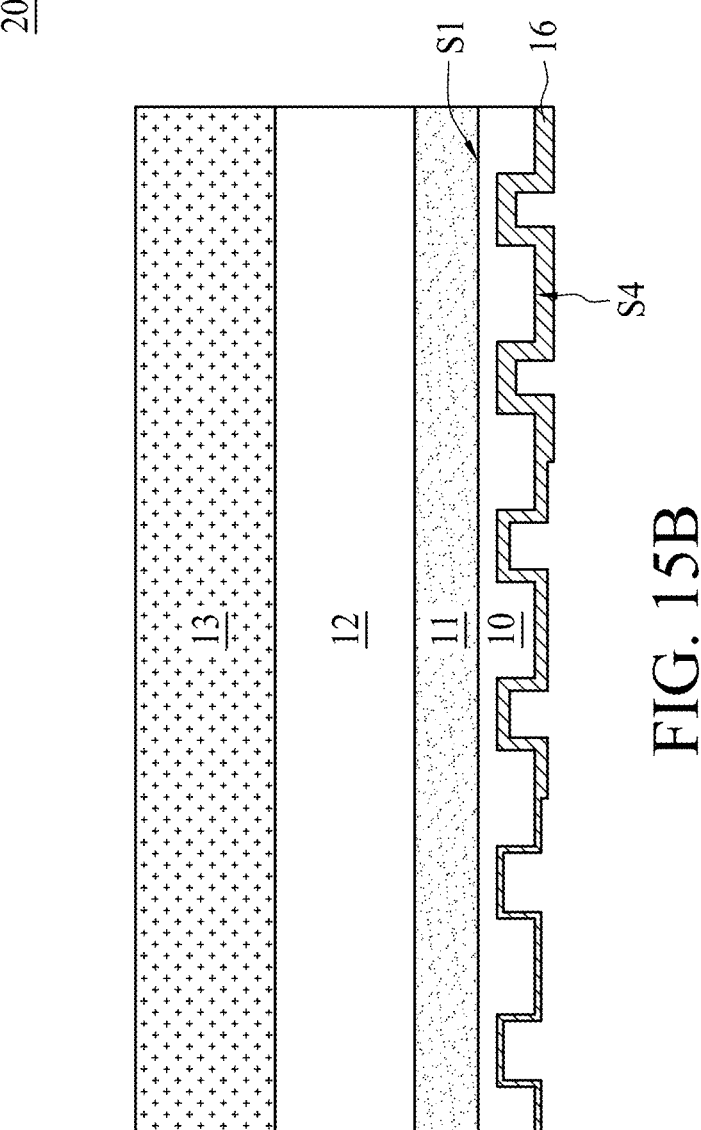

In operation 223 of FIG. 3, a sawing operation is performed on the semiconductor device 50 to form multiple semiconductor chips 20, as showing in FIGS. 15A and 15B. Referring to FIG. 15A, in some embodiments, elements formed over the substrate 104, including device layer 110, the interconnect layer 120, the luminous layer 130 and the capping layer 160 are designed to be evenly distributed in blocks 52 which are separated by scribe lines or cutting lines 54. The scribe lines 54 may define a programmed die dimension. The dimension of the blocks 52 shown in FIG. 15A is just exemplary. Although not illustrated, the sawing operation may include a wafer mounting step and a wafer sawing step. During the wafer mounting step, the semiconductor device 50 and a wafer frame are simultaneously attached on a dicing tape. The wafer frame may be made of plastic or metals. The wafer frame is resistant to warping, bending, corrosion, and heat. The dicing tape (also referred to as a wafer film) is a PVC sheet with synthetic adhesive on one side to hold both the wafer frame and the substrate 104. During the wafer sawing step, the frame-mounted semiconductor device 50 is automatically aligned into position for cutting. Subsequently, the frame-mounted semiconductor device 50 is cut along the scribe lines using a resin-bonded diamond wheel rotating at a high revolution per minute (rpm). As a result, the semiconductor device 50 is divided into multiple semiconductor chips 20.

Referring to 15B, in some embodiments, each semiconductor chip 20 include its individual functional portions from the substrate 104, the device layer 110, the interconnect layer 120, the luminous layer 130 and the capping layer 160 of the semiconductor device 50, which are respectively referred to as a substrate 10, a device layer 11, an interconnect layer 12, a luminous layer 13 and a capping layer 16.

Figure 16A:
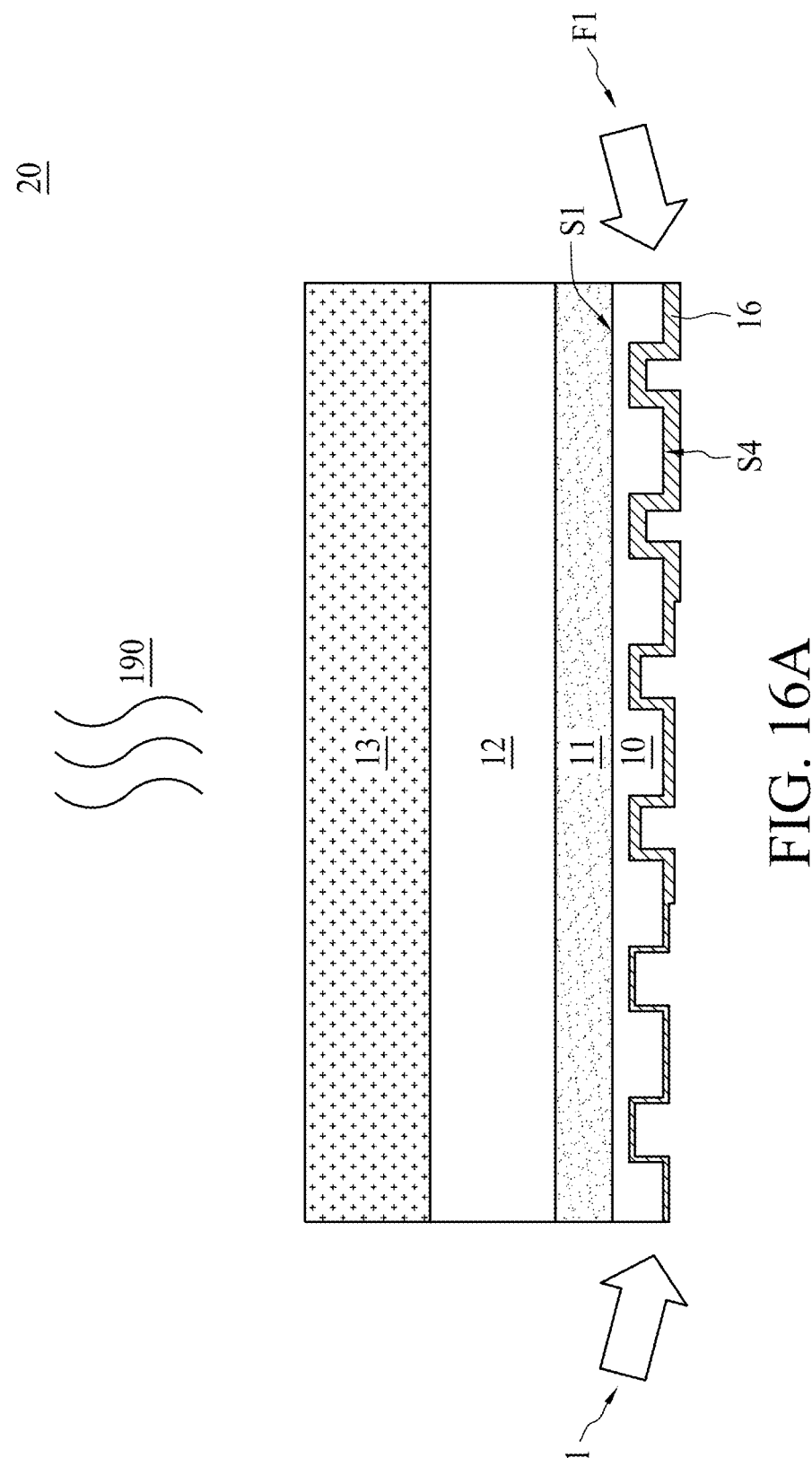
Figure 16B:
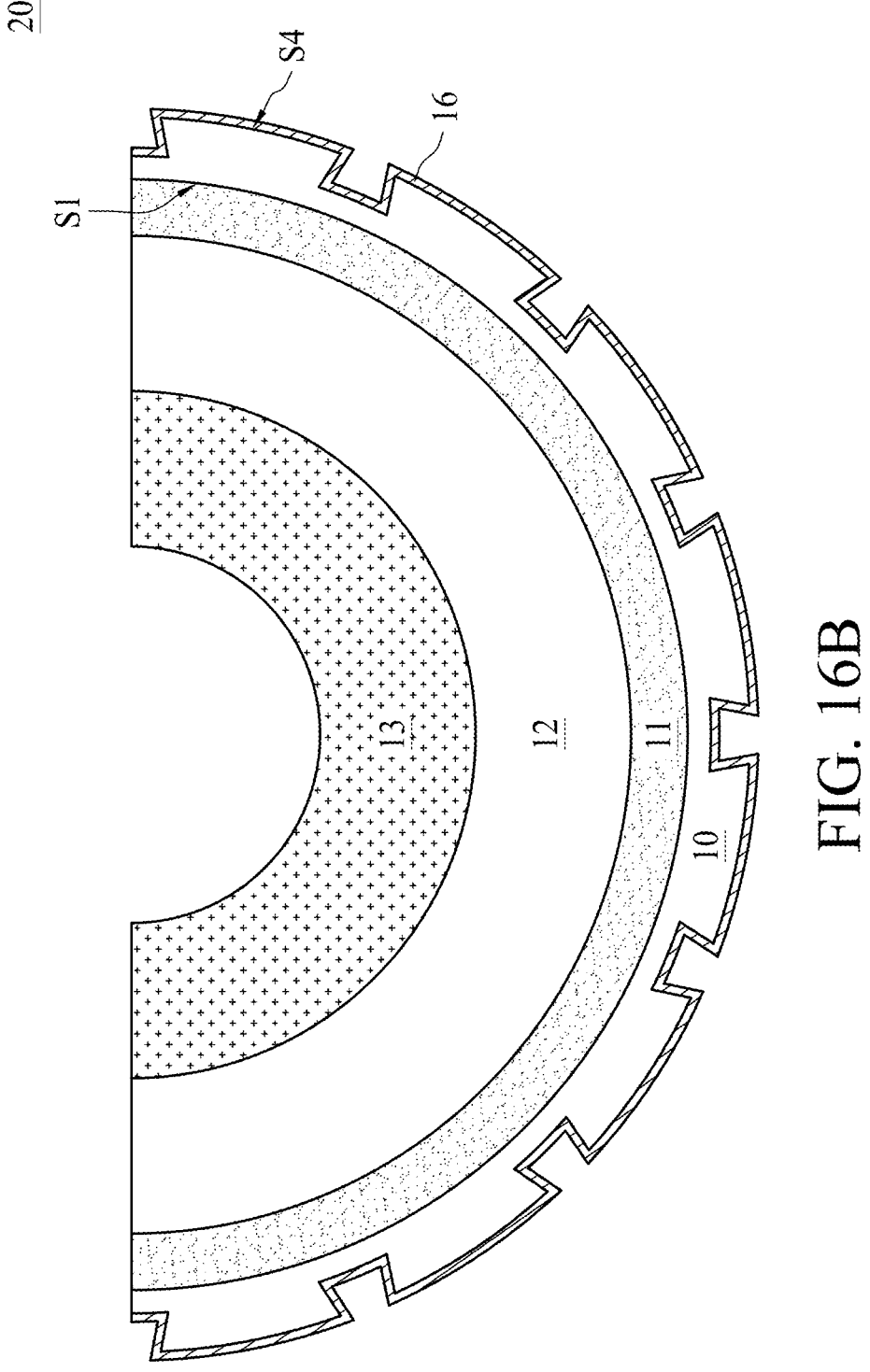
Figure 16C:

In operation 225 of FIG. 3, a heating operation 190 is performed on one or more semiconductor chips 20, as shown in FIGS. 16A to 16C. Referring to FIG. 16A, in some embodiments, a batch heating machine such as a furnace or a single heating machine such as a rapid thermal annealing (RTA) machine is used in the heating operation 190. The RTA machine may include a lamp based heating, a hot chuck, or a hot plate that the semiconductor chip 20 is brought near. The heating operation 190 may heat the semiconductor chip 20 to high temperature for not more than a few seconds. In some embodiments, the heating operation 190 is performed at a temperature between about 125° C. and about 1100° C. In some embodiments, since the coefficients of thermal expansion (CTE) of the substrate 10 and the capping layer 16 are different, a residual film stress is generated between the substrate 10 and the capping layer 16 during the heating operation 190. As shown in FIG. 16A, a compressive stress F1 may be generated in the capping layer 16. The compressive stress F1 in the capping layer 16 may cause the substrate 10 and elements over the substrate 10 to warp.

Referring to FIG. 16B, which is an exemplary figure showing a curved profile of the semiconductor chip 20 after the heating operation 190. The compressive stress F1 in the capping layer 16 may cause the substrate 10 to bend. The device layer 11, the interconnect layer 12 and the luminous layer 13 may be curved at the same time. As a result, the semiconductor chip 20 forms a convex curved profile. At this stage, the semiconductor chip 20 is complete. The semiconductor chip 20 may have a curved or smile profile. The substrate 10 may be outwardly curved from the top surface S1 towards the bottom surface S4 on which the capping layer 16 is disposed. In some embodiment, a length of the top surface S1 is less than a length of the bottom surface S4. The top surface S1 and the bottom surface S4 may have the same curvature. In some embodiments, the substrate 10, the device layer 11, the interconnect layer 12, the luminous layer 13 and the capping layer 16 are curved. The substrate 10, the device layer 11, the interconnect layer 12, the luminous layer 13 and the capping layer 16 may have the same curvature. The luminous layer 13 including various optical display devices such as LCD, LED, micro LED, OLED or quantum dot display is conformally formed in the semiconductor chip 20 such that these optical display devices are also arranged in a curved manner. The optical display devices can provide users with a better field of view.

The semiconductor chip 20 may be used in near eye displays, head mounted displays (HMD) or wearable displays and can create a complete virtual image in the field of view of one or both eyes. To the users, the virtual image provided by the semiconductor chip 20 can appear at a distance and appears much larger than flat display panels and optics used to create the image.

Referring to FIG. 16C, which is an enlarged view of FIG. 16B, the capping layer 16 includes a first portion 1611, a second portion 1612 and a third portion 1613. The first portion 1611, the second portion 1612 and the third portion 1613 of the semiconductor chip 20 may respectively correspond to the first portion 161, the second portion 162 and the third portion 163 of the semiconductor device 50. The portions 1611, 1612 and 1613 of the capping layer 16 may have different thicknesses. In some embodiments, a thickness A11 of the third portion 1613 is greater than a thickness B11 of the second portion 1612, and the thickness B11 of the second portion 1612 is greater than a thickness C1 of the first portion 1611. The thicknesses A11, B11, C11 may be respectively equal to the thicknesses A1, B1, C1 shown in FIG. 13E. Since the semiconductor chip 20 is divided from the semiconductor device 50, the substrate 10 of the semiconductor chip 20 also has the trenches T1 alternately arranged with the protrusions 104P. The capping layer 16 does not completely fill the trenches T1. The first portion 1611 may surround one or more openings O1611, the second portion 1612 may surround one or more openings O1612 and the third portion 1613 may surround one or more openings O1613.

Figure 17:
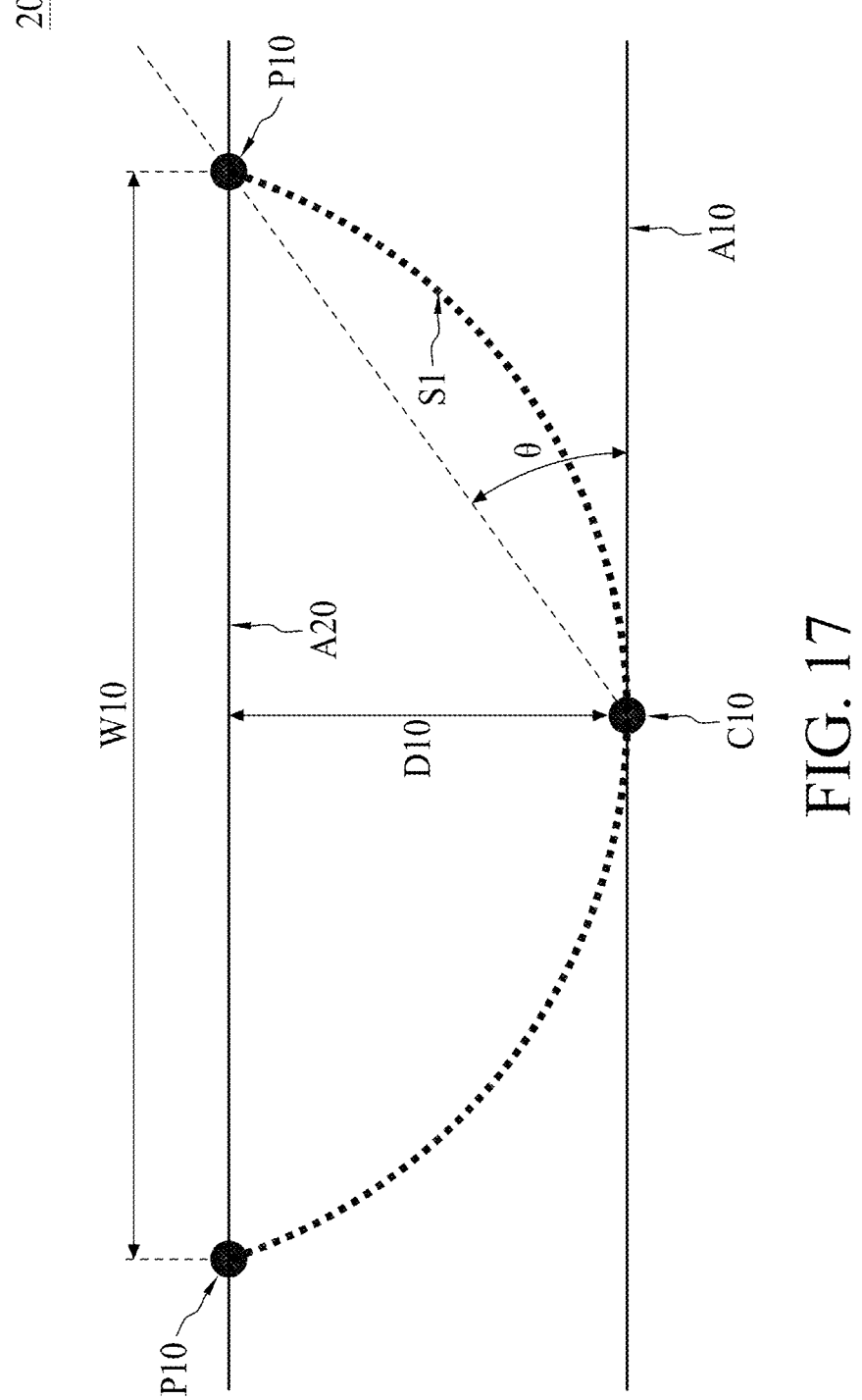
FIG. 17 is a simplified schematic view of FIG. 16C, in accordance with some embodiments of the present disclosure.

FIG. 17 is a simplified schematic view of FIG. 16C. The dotted line depicts the top surface S1 of the substrate 10 in FIG. 16C. A center point of the top surface S1, which is also the lowest point of the device layer 11 is referred to as a point C10. A pair of peripheral points of the top surface S1, which are also at opposite edges of the device layer 11 are referred to as points P10. A plane tangent to the point C10 is referred to as A10, and a plane passing the pair of points P10 is referred to as A20. The plane A20 and the plane A10 are in parallel. In some embodiments, a distance D10 between the plane A20 and the plane A10 is between about 0.02 mm and about 50 mm. In some embodiments, a distance W10 between the pair of points P10 is between about 1 mm and about 150 mm. In some embodiments, an angle θ is between the A10 plane and a connection line passing the points C10 and P10. The angle θ may be between about 2.29° and about 33.69°.

One aspect of the present disclosure provides a semiconductor device. The semiconductor device includes: a substrate, having a first side and a second side opposite to the first side, wherein the substrate includes a plurality of trenches at the second side; a device layer, disposed on the first side of the substrate; an interconnect layer, disposed on the device layer; a luminous layer, disposed on the interconnect layer; and a capping layer, conformally disposed on the second side of the bended substrate. The semiconductor device is convexly curved.

One aspect of the present disclosure provides another semiconductor device. The semiconductor device includes: a substrate, having a first surface and a second surface opposite to the first surface; a transistor layer, conformally covering the first surface of the substrate; an interconnect layer, conformally covering the transistor layer; an optical device layer, conformally covering the interconnect layer; and a capping layer, conformally covering the second surface of the substrate, wherein the capping layer has an inconsistent thickness along the second surface of the substrate.

Another aspect of the present disclosure provides a method of manufacturing a semiconductor device. The method includes: providing a substrate, the substrate having a first side and a second side opposite to the first side; forming a device layer over the first side of the substrate; forming an interconnect layer over the device layer; forming a luminous layer over the interconnect layer; forming a plurality of trenches on the second side of the substrate; conformally depositing a capping layer on the second side of the substrate; sawing the substrate, the device layer, the interconnect layer, the luminous layer and the capping layer to form a plurality of chips; and heating at least one of the plurality of chips, whereby convexly bending the at least one of the plurality of chips.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate, having a first side and a second side opposite to the first side, wherein the substrate includes a plurality of trenches at the second side;
a device layer, disposed on the first side of the substrate;
an interconnect layer, disposed on the device layer;
a luminous layer, disposed on the interconnect layer; and
a capping layer, conformally disposed on the second side of the substrate,
wherein the semiconductor device is convexly curved, wherein the capping layer includes a plurality of openings disposed within the plurality of trenches correspondingly, and a first thickness of the capping layer within one of the plurality of trenches is substantially different from a second thickness of the capping layer within another one of the plurality of trenches.

2. The semiconductor device of claim 1, wherein the luminous layer and the substrate have same curvature.

3. The semiconductor device of claim 1, wherein each of the plurality of trenches has a depth between about 5 nanometers (nm) and about 50 micrometers (μm).

4. The semiconductor device of claim 1, wherein each of the plurality of trenches has a width between about 5 nm and about 50 μm.

5. The semiconductor device of claim 1, wherein the luminous layer includes a plurality of optical devices.

6. The semiconductor device of claim 1, wherein the substrate is outwardly curved from the first side towards the second side.

7. The semiconductor device of claim 1, wherein the first side and the second side have same curvature.

8. The semiconductor device of claim 1, wherein a length of the first side is substantially less than a length of the second side.

9. A semiconductor device, comprising:
a substrate, having a first surface and a second surface opposite to the first surface, wherein the substrate includes a first trench and a second trench at the second surface;
a transistor layer, conformally covering the first surface of the substrate;
an interconnect layer, conformally covering the transistor layer;
an optical device layer, conformally covering the interconnect layer; and
a capping layer, conformally covering the second surface of the substrate, wherein a first thickness of the capping layer within the first trench is substantially different from a second thickness of the capping layer within the second trench.

10. The semiconductor device of claim 9, wherein a total thickness of the transistor layer and the substrate is between about 10 μm and about 1000 μm.

11. The semiconductor device of claim 9, wherein the capping layer has a thickness between about 5 angstroms (Å) and about 100 nm.

12. The semiconductor device of claim 9, wherein the substrate, the transistor layer, the interconnect layer, the optical device layer and the capping layer have same curvature.

13. The semiconductor device of claim 9, wherein the substrate includes a plurality of protrusions disposed at the second surface.

14. The semiconductor device of claim 13, wherein the capping layer on one of the plurality of protrusions has an inconsistent thickness.

15. A semiconductor device, comprising:
a substrate, having a first side and a second side opposite to the first side, wherein the substrate includes a plurality of protrusions at the second side;
a device layer, disposed on the first side of the substrate;
an interconnect layer, disposed on the device layer;
a luminous layer, disposed on the interconnect layer; and
a capping layer, conformally covering the plurality of protrusions and including a plurality of openings alternately disposed with the plurality of protrusions, wherein the capping layer has a first portion connected with a second portion, and a thickness of the second portion is greater than a thickness of the first portion, wherein the first portion of the capping layer surrounds a first opening, and the second portion of the capping layer surrounds a second opening.

16. The semiconductor device of claim 15, wherein the substrate is bended.

17. The semiconductor device of claim 15, wherein the luminous layer and the substrate have same curvature.

18. The semiconductor device of claim 15, wherein the substrate, the device layer, the interconnect layer, and the luminous layer have same curvature.

19. The semiconductor device of claim 15, wherein the first opening and the second opening are separated by one of the plurality of protrusions.

20. The semiconductor device of claim 15, wherein the first opening and the second opening have different volumes.

* * * * *